(12) United States Patent
Elsherbini et al.

(10) Patent No.: US 11,527,501 B1
(45) Date of Patent: Dec. 13, 2022

(54) SACRIFICIAL REDISTRIBUTION LAYER IN MICROELECTRONIC ASSEMBLIES HAVING DIRECT BONDING

(71) Applicant: Intel Corporation, Santa Clara, CA (US)

(72) Inventors: Adel A. Elsherbini, Tempe, AZ (US); Veronica Aleman Strong, Hillsboro, OR (US); Shawna M. Liff, Scottsdale, AZ (US); Brandon M. Rawlings, Chandler, AZ (US); Jagat Shakya, Hillsboro, OR (US); Johanna M. Swan, Scottsdale, AZ (US); David M. Craig, Hillsboro, OR (US); Jeremy Alan Streifer, Beaverton, OR (US); Brennen Karl Mueller, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 17/122,934

(22) Filed: Dec. 15, 2020

(51) Int. Cl.
*H01L 23/00* (2006.01)
*H01L 21/18* (2006.01)
*B81B 7/00* (2006.01)

(52) U.S. Cl.
CPC ............ *H01L 24/06* (2013.01); *B81B 7/0006* (2013.01); *B81B 7/007* (2013.01)

(58) Field of Classification Search
CPC .................. H01L 24/06; H01L 21/187; H01L 2224/80894; H01L 2224/80895; H01L 2224/81894; H01L 2224/81895; H01L 2224/82895; H01L 2224/82896; H01L 2224/83894; H01L 2224/83895; H01L 2224/84895; H01L 2224/84897; H01L 2224/8583; H01L 2224/85895;
(Continued)

(56) References Cited

U.S. PATENT DOCUMENTS 7,749,886 B2 7/2010 Oganesian et al.
10,529,634 B2 1/2020 Delacruz et al.
(Continued)

FOREIGN PATENT DOCUMENTS

EP 3832712 A1 6/2021
WO 2021158881 A1 8/2021

*Primary Examiner* — Didarul A Mazumder
(74) *Attorney, Agent, or Firm* — Akona IP PC

(57) ABSTRACT

Microelectronic assemblies, related devices and methods, are disclosed herein. In some embodiments, a microelectronic assembly may include a first microelectronic component having a first direct bonding region, wherein the first direct bonding region includes first metal contacts and a first dielectric material between adjacent ones of the first metal contacts; a second microelectronic component having a second direct bonding region and coupled to the first microelectronic component by the first and second direct bonding regions, wherein the second direct bonding region includes second metal contacts and a second dielectric material between adjacent ones of the second metal contacts, and wherein individual first metal contacts in the first direct bonding region are coupled to respective individual second metal contacts in the second direct bonding region; and a void between an individual first metal contact and a respective individual second metal contact.

11 Claims, 11 Drawing Sheets

(58) Field of Classification Search
CPC . H01L 2224/85897; H01L 2224/86895; H01L 2224/86896; B81B 7/0006; B81B 7/007
USPC ........................................................ 257/773
See application file for complete search history.

(56) References Cited

U.S. PATENT DOCUMENTS

| | | |
|---|---|---|
| 10,658,313 B2 | 5/2020 | Delacruz et al. |
| 2017/0062366 A1* | 3/2017 | Enquist ................... H01L 24/05 |
| 2020/0126906 A1* | 4/2020 | Uzoh ................ H01L 21/76898 |

* cited by examiner

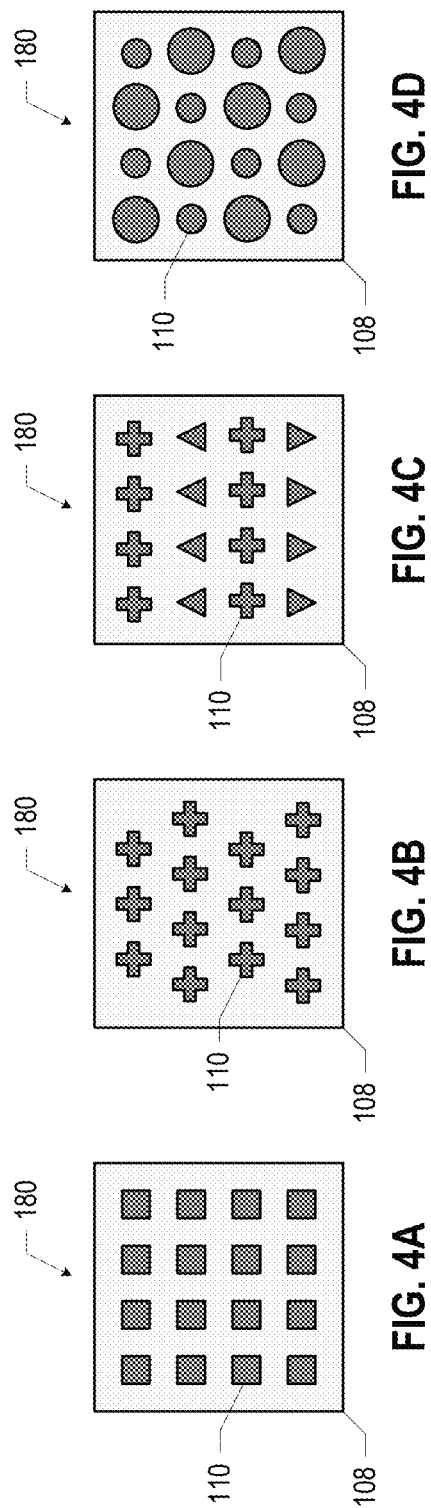

SACRIFICIAL REDISTRIBUTION LAYER IN MICROELECTRONIC ASSEMBLIES HAVING DIRECT BONDING

BACKGROUND

Integrated circuit (IC) dies are coupled to a package substrate or to each other by direct bonding for improved interconnect pitch and reduced z-height. Testing IC die functionality so that only known good dies are coupled to a package substrate or to other known good dies increases manufacturing assembly throughput and reduces costs.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, not by way of limitation, in the figures of the accompanying drawings.

FIGS. 4A-4D are top views of example direct bonding interfaces of a microelectronic component, in accordance with various embodiments.

DETAILED DESCRIPTION

Figure 1:
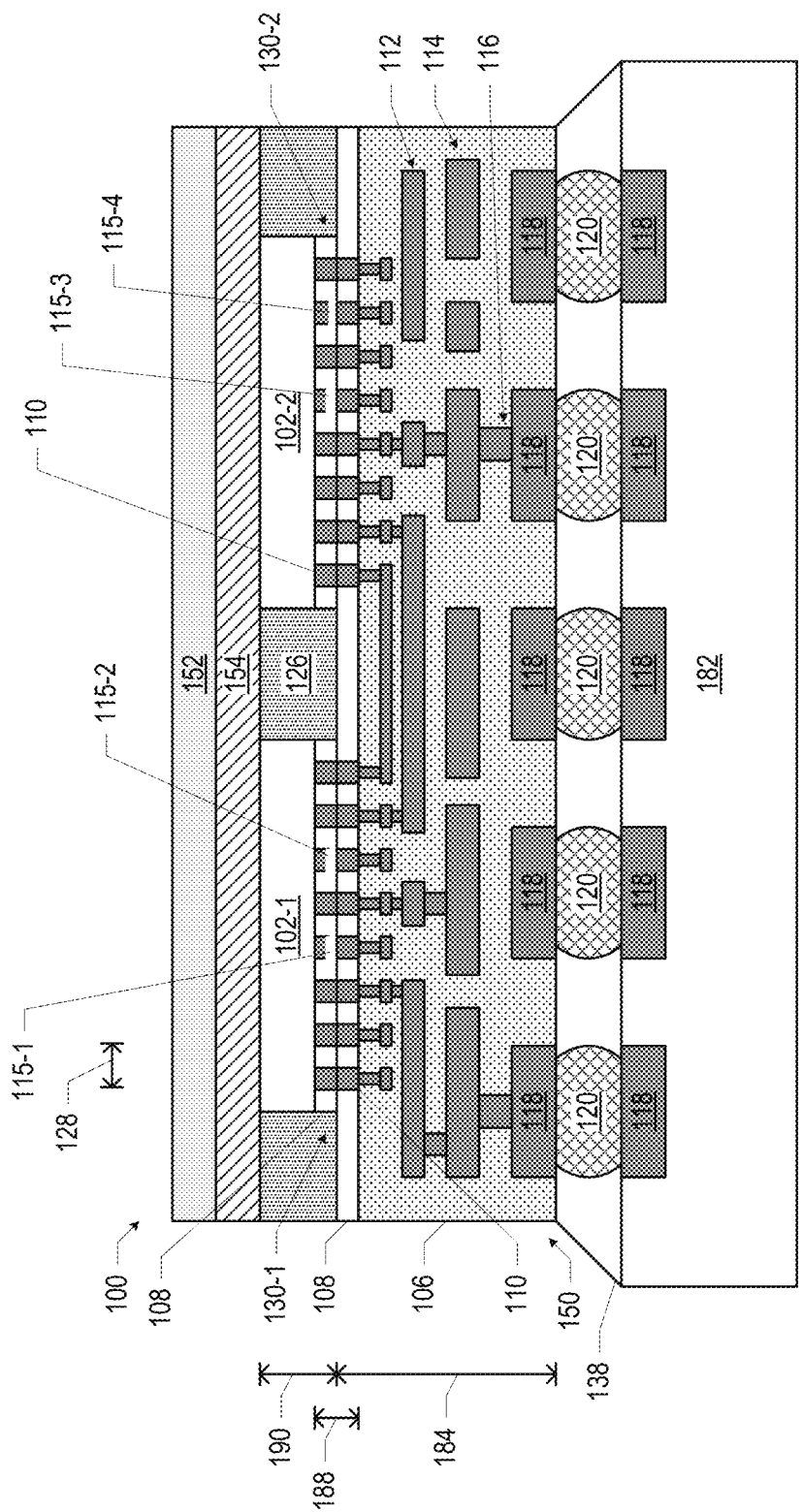
FIG. 1 is a side, cross-sectional view of an example microelectronic assembly including a void in a direct bonding region, in accordance with various embodiments.

Microelectronic assemblies, and related devices and methods, are disclosed herein. For example, in some embodiments, a microelectronic assembly may include a first microelectronic component having a first direct bonding region, wherein the first direct bonding region includes first metal contacts and a first dielectric material between adjacent ones of the first metal contacts; a second microelectronic component having a second direct bonding region and coupled to the first microelectronic component by the first and second direct bonding regions, wherein the second direct bonding region includes second metal contacts and a second dielectric material between adjacent ones of the second metal contacts, and wherein individual first metal contacts in the first direct bonding region are coupled to respective individual second metal contacts in the second direct bonding region; and a void between an individual first metal contact and a respective individual second metal contact.

Coupling two or more components via direct bonding in a multi-die IC package is challenging due to the increasingly small size and thickness of such components, the finer pitch of interconnects, and the reduced thickness of the bonding interface between components (e.g., z-height of die-to-die spacing), among others. Direct bonding requires an extremely clean bonding surface and does not allow for interconnects to extend beyond the bonding plane (e.g., an interconnect bonding surface must be flush with a direct bonding interface) in order to prevent voids and/or incomplete connections. Conventional methods for testing die functionality (e.g., to identify known good dies (KGD) during manufacturing) include using standard probing techniques to land on die pads, such probes are then scrubbed against the pad surface to improve contact during testing. The scrubbing of the die pads creates particle and material pileup that extends beyond the bonding plane, which is likely to cause inadequate coupling of the direct bonding connections. Other conventional approaches include testing die pads on a lower layer (e.g., pads on a layer within the die and not on an uppermost layer), which requires a minimum pad size and spacing and is not compatible with testing singulated dies. Another conventional approach includes creating sacrificial pads for testing, which eliminates particle and material pileup at the bonding plane but causes a significant loss of interconnect density at the bonding plane as the areas that had sacrificial pads will not bond. Further, in the areas that had sacrificial pads, the oxide-oxide contact area at the direct bonding interface between the dies is reduced, which decreases the initial adhesion strength and the final bond strength of the direct bonding connections. Various ones of the microelectronic assemblies disclosed herein may exhibit better assembly yields during manufacturing and improved performance and reliability during use relative to conventional approaches by providing a sacrificial redistribution layer having pads for testing.

In the following detailed description, reference is made to the accompanying drawings that form a part hereof wherein like numerals designate like parts throughout, and in which is shown, by way of illustration, embodiments that may be practiced. It is to be understood that other embodiments may be utilized, and structural or logical changes may be made without departing from the scope of the present disclosure. Therefore, the following detailed description is not to be taken in a limiting sense.

Various operations may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). The drawings are not necessarily to scale. Although many of the drawings illustrate rectilinear structures with flat walls and right-angle corners, this is simply for ease of illustration, and actual devices made using these techniques will exhibit rounded corners, surface roughness, and other features.

The description uses the phrases "in an embodiment" or "in embodiments," which may each refer to one or more of the same or different embodiments. Furthermore, the terms "comprising," "including," "having," and the like, as used with respect to embodiments of the present disclosure, are synonymous. When used to describe a range of dimensions, the phrase "between X and Y" represents a range that includes X and Y. The terms "top," "bottom," etc. may be used herein to explain various features of the drawings, but these terms are simply for ease of discussion, and do not imply a desired or required orientation. Although certain elements may be referred to in the singular herein, such elements may include multiple sub-elements. For example, "a dielectric material" may include one or more dielectric materials. As used herein, a "conductive contact" may refer to a portion of conductive material (e.g., metal) serving as an electrical interface between different components; conductive contacts may be recessed in, flush with, or extending away from a surface of a component, and may take any suitable form (e.g., a conductive pad or socket, or portion of a conductive line or via). For ease of discussion, the drawings of FIGS. 4A-4D may be referred to herein as "FIG. 4" and the drawings of FIGS. 5A-5G may be referred to herein as "FIG. 5," etc.

FIG. 1 is a side, cross-sectional view of a microelectronic assembly 100 including a void at the direct bonding region, in accordance with various embodiments. The microelectronic assembly 100 may include an interposer 150 with an organic material 106, a first microelectronic component 102-1 coupled to the interposer 150 via a first direct bonding region 130-1 having one or more voids 115-1, 115-2, and a second microelectronic component 102-2 coupled to the interposer 150 via a second direct bonding region 130-2 having one or more voids 115-3, 115-4. As used herein, a void 115 refers to a space between an individual DB contact 110 of the microelectronic component 102 and a respective individual DB contact 110 of the interposer 150, where the individual DB contacts 110 are not in contact in the DB bonding region 130. A void 115 may further refer to a space between an individual DB contact 110 of a microelectronic component 102 and a respective individual DB contact 110 of another microelectronic component 102, such as described below with reference to FIG. 3. A void 115 may be formed by the selective removal of a sacrificial testing redistribution layer (RDL), where the DB contacts 110 that are coupled to RDL testing pads are thinned during the removal of the RDL, as described below with reference to FIG. 5. In some embodiments, a thickness of the void is between 1 nanometer and 100 nanometers (e.g., a z-distance between an individual DB contact 110 on the interposer 150 and a respective individual DB contact 110 on the microelectronic component 102 in the DB bonding region 130). In some embodiments, a thickness of the void is between 1 nanometer and 10 nanometers. In some embodiments, a thickness of the void is between 10 nanometers and 100 nanometers. Although FIG. 1 illustrates the microelectronic assembly 100 having two voids 115 within a single DB bonding region 130 (e.g., voids 115-1, 115-2 on microelectronic component 102-1 within DB bonding region 130-1 and voids 115-3, 115-4 on microelectronic component 102-2 within DB bonding region 130-2), a DB bonding region 130 may include any suitable number and arrangement of voids 115. For example, as described below with reference to FIGS. 6-7, a DB bonding region 130 may include a plurality of voids 115 based on a number of DB contacts 110 that couple to RDL testing pads and the plurality of voids 115 may be patterned based on an arrangement of the DB contacts 110 that couple to the RDL testing pads. In some embodiments, the plurality of voids 115 may be arranged in a repeating pattern. In some embodiments, the plurality of voids 115 may be distributed uniformly throughout the DB bonding region 130. In some embodiments, the plurality of voids 115 may be more concentrated in a first area of the DB bonding region 130 as compared to a second area of the DB bonding region 130 (e.g., the plurality of voids 115 has a first concentration in a perimeter area or an outside edge of the DB bonding region 130 and a second concentration that is less than the first concentration in an inner area of the DB bonding region 130). In some embodiments, a number of voids 115 in a DB bonding region is between 10 percent and 50 percent (e.g., between 10 percent and 50 percent of a total number of DB contacts 110 in a DB bonding region 130 include voids 115). In some embodiments, a ratio of DB contacts having voids 115 to a total number of DB contacts 110 in the DB bonding region 130 is between 1:2 and 1:10. In some embodiments, a ratio of DB contacts having voids 115 to a total number of DB contacts 110 in the DB bonding region 130 is between 1:8 and 1:12.

The microelectronic assembly 100 may further include a mold material 126, a support component 182, an underfill material 138, a heat transfer structure 152, and a thermal interface material (TIM) 154. A number of elements are illustrated in FIG. 1 as included in the microelectronic assembly 100, but a number of these elements may not be present in a microelectronic assembly 100. For example, in various embodiments, the second microelectronic component 102-2, the mold material 126, the underfill material 138, the support component 182, the underfill material 138, the heat transfer structure 152, and/or the thermal interface material (TIM) 154 may not be included. Further, FIG. 1 illustrates a number of elements that are omitted from subsequent drawings for ease of illustration, but may be included in any of the microelectronic assemblies 100 disclosed herein. Examples of such elements include the mold material 126, the underfill material 138, the support component 182, the underfill material 138, the heat transfer structure 152, and/or the thermal interface material (TIM) 154. Many of the elements of the microelectronic assembly 100 of FIG. 1 are included in other ones of the accompanying drawings; the discussion of these elements is not repeated when discussing these drawings, and any of these elements may take any of the forms disclosed herein. In some embodiments, individual ones of the microelectronic assemblies 100 disclosed herein may serve as a system-in-package (SiP) in which multiple microelectronic components 102 having different functionality are included. In such embodiments, the microelectronic assembly 100 may be referred to as an SiP.

Figure 2:
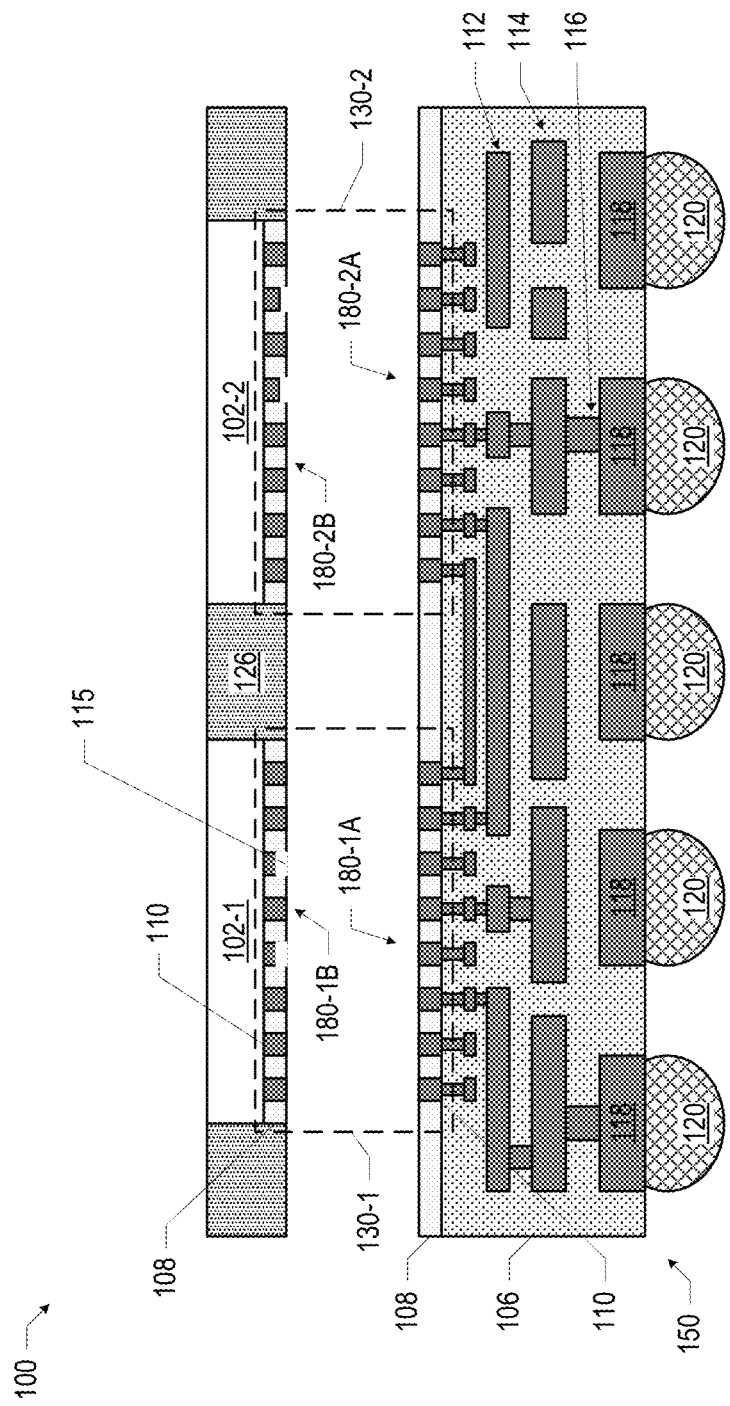
FIG. 2 is a side, cross-sectional exploded view of a portion of the microelectronic assembly of FIG. 1, in accordance with various embodiments.

The microelectronic assembly 100 may include an interposer 150 coupled to a microelectronic component 102-1 by a direct bonding (DB) region 130-1, which may include voids 115. In particular, as illustrated in FIG. 2, the DB region 130-1 may include a DB interface 180-1A at the top surface of the interposer 150, with the DB interface 180-1A including a set of conductive DB contacts 110 and a DB dielectric 108 around the DB contacts 110 of the DB interface 180-1A. The DB region 130-1 may also include a DB interface 180-1B at the bottom surface of the microelectronic component 102-1, with the DB interface 180-1B including a set of DB contacts 110 and a DB dielectric 108 around the DB contacts 110 of the DB interface 180-1B. The DB contacts 110 of the DB interface 180-1A of the interposer 150 may align with the DB contacts 110 of the DB interface 180-1B of the microelectronic component 102-1 so that, in the microelectronic assembly 100, the DB contacts 110 of the microelectronic component 102-1 are in contact with the DB contacts 110 of the interposer 150 except for the DB contacts 110 that have been thinned by removal of the RDL layer (e.g., as shown in FIG. 5), such that a void 115 is formed. In the microelectronic assembly 100 of FIG. 1, the DB interface 180-1A of the interposer 150 may be bonded (e.g., electrically and mechanically) with the DB interface 180-1B of the microelectronic component 102-1 to form the DB region 130-1 coupling the interposer 150 and the microelectronic component 102-1, as discussed further below. More generally, the DB regions 130 disclosed herein may include two complementary DB interfaces 180 bonded together; for ease of illustration, many of the subsequent drawings may omit the identification of the DB interfaces 180 to improve the clarity of the drawings.

As used herein, the term "direct bonding" is used to include metal-to-metal bonding techniques (e.g., copper-to-copper bonding, or other techniques in which the DB contacts 110 of opposing DB interfaces 180 are brought into contact first, then subject to heat and/or compression) and hybrid bonding techniques (e.g., techniques in which the DB dielectric 108 of opposing DB interfaces 180 are brought into contact first, then subject to heat and sometimes compression, or techniques in which the DB contacts 110 and the DB dielectric 108 of opposing DB interfaces 180 are brought into contact substantially simultaneously, then subject to heat and compression). In such techniques, the DB contacts 110 and the DB dielectric 108 at one DB interface 180 are brought into contact with the DB contacts 110 and the DB dielectric 108 at another DB interface 180, respectively, and elevated pressures and/or temperatures may be applied to cause the contacting DB contacts 110 and/or the contacting DB dielectrics 108 to bond. In some embodiments, this bond may be achieved without the use of intervening solder or an anisotropic conductive material, while in some other embodiments, a thin cap of solder may be used in a DB interconnect to accommodate planarity, and this solder may become an intermetallic compound (IMC) in the DB region 130 during processing. DB interconnects may be capable of reliably conducting a higher current than other types of interconnects; for example, some conventional solder interconnects may form large volumes of brittle IMCs when current flows, and the maximum current provided through such interconnects may be constrained to mitigate mechanical failure. Although FIGS. 1 and 2 show the DB dielectric 108 as extending fully along the entire second surface 151-2 of the interposer 150, in some embodiments, the DB dielectric 108 may extend only along a portion of the second surface 151-2 of the interposer 150, for example, such that the DB dielectric 108 is only within the DB region 130.

A DB dielectric 108 may include one or more dielectric materials, such as one or more inorganic dielectric materials. For example, a DB dielectric 108 may include silicon and nitrogen (e.g., in the form of silicon nitride); silicon and oxygen (e.g., in the form of silicon oxide); silicon, carbon, and nitrogen (e.g., in the form of silicon carbonitride); carbon and oxygen (e.g., in the form of a carbon-doped oxide); silicon, oxygen, and nitrogen (e.g., in the form of silicon oxynitride); aluminum and oxygen (e.g., in the form of aluminum oxide); titanium and oxygen (e.g., in the form of titanium oxide); hafnium and oxygen (e.g., in the form of hafnium oxide); silicon, oxygen, carbon, and hydrogen (e.g., in the form of tetraethyl orthosilicate (TEOS)); zirconium and oxygen (e.g., in the form of zirconium oxide); niobium and oxygen (e.g., in the form of niobium oxide); tantalum and oxygen (e.g., in the form of tantalum oxide); and combinations thereof.

A DB contact 110 may include a pillar, a pad, or other structure. The DB contacts 110, although depicted in the accompanying drawings in the same manner at both DB interfaces 180 of a DB region 130, may have a same structure at both DB interfaces 180, or the DB contacts 110 at different DB interfaces 180 may have different structures. For example, in some embodiments, a DB contact 110 in one DB interface 180 may include a metal pillar (e.g., a copper pillar), and a complementary DB contact 110 in a complementary DB interface 180 may include a metal pad (e.g., a copper pad) recessed in a dielectric. A DB contact 110 may include any one or more conductive materials, such as copper, manganese, titanium, gold, silver, palladium, nickel, copper and aluminum (e.g., in the form of a copper aluminum alloy), tantalum (e.g., tantalum metal, or tantalum and nitrogen in the form of tantalum nitride), cobalt, cobalt and iron (e.g., in the form of a cobalt iron alloy), or any alloys of any of the foregoing (e.g., copper, manganese, and nickel in the form of manganin). In some embodiments, the DB dielectric 108 and the DB contacts 110 of a DB interface 180 may be manufactured using low-temperature deposition techniques (e.g., techniques in which deposition occurs at temperatures below 250 degrees Celsius, or below 200 degrees Celsius), such as low-temperature plasma-enhanced chemical vapor deposition (PECVD).

Figure 3:
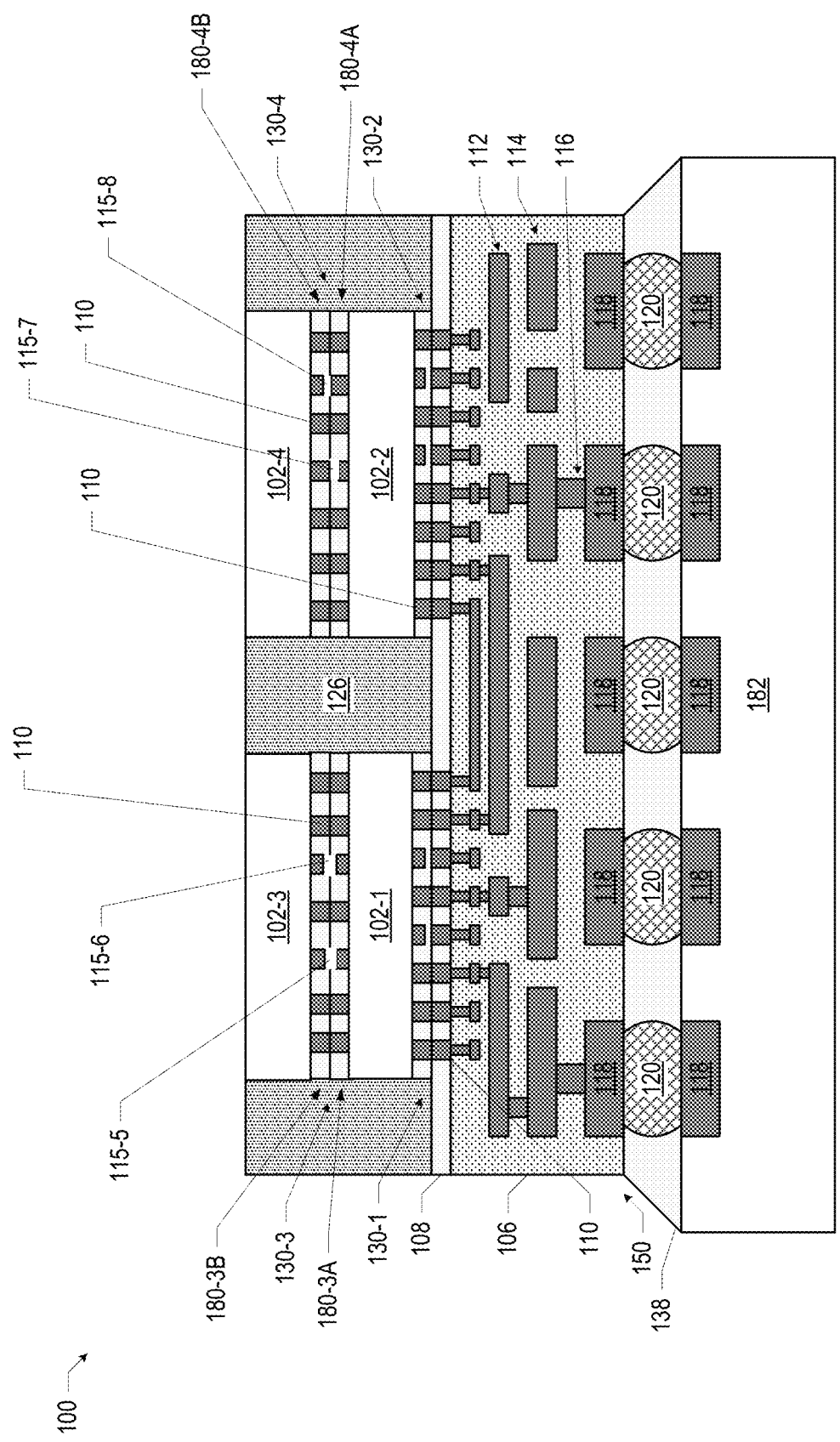
FIG. 3 is a side, cross-sectional view of an example microelectronic assembly including a void in a direct bonding region, in accordance with various embodiments.

FIGS. 1 and 2 also illustrate the microelectronic component 102-2 coupled to the interposer 150 by a DB region 130-2 (via the DB interfaces 180-2A and 180-2B, as shown in FIG. 2). Although FIG. 1 depicts a particular number of microelectronic components 102 coupled to the interposer 150 and to other microelectronic components 102 by DB regions 130, this number and arrangement are simply illustrative, and a microelectronic assembly 100 may include any desired number and arrangement of microelectronic components 102 coupled to an interposer 150 and to other microelectronic components 102 by DB regions 130 as well as stacked microelectronic components 102, for example, as shown in FIG. 3. Although a single reference numeral "108" is used to refer to the DB dielectrics of multiple different DB interfaces 180 (and different DB regions 130), this is simply for ease of illustration, and the DB dielectric 108 of different DB interfaces 180 (even within a single DB region 130) may have different materials and/or structures. Similarly, although a single reference numeral "110" is used to refer to the DB contacts of multiple different DB interfaces 180 (and different DB regions 130), this is simply for ease of illustration, and the DB contacts 110 of different DB interfaces 180 (even within a single DB region 130) may have different materials and/or structures.

The interposer 150 may include an insulating material 106 (e.g., one or more dielectric materials formed in multiple layers, as known in the art) and one or more conductive pathways 112 through the insulating material 106 (e.g., including conductive lines 114 and/or conductive vias 116, as shown). In some embodiments, the insulating material 106 of the interposer 150 includes an inorganic dielectric material, such as silicon and nitrogen (e.g., in the form of silicon nitride); silicon and oxygen (e.g., in the form of silicon oxide); silicon and carbon (e.g., in the form of silicon carbide); silicon, carbon, and oxygen (e.g., in the form of silicon oxycarbide); silicon, carbon, and nitrogen (e.g., in the form of silicon carbonitride); carbon and oxygen (e.g., in the form of a carbon-doped oxide); silicon, oxygen, and nitrogen (e.g., in the form of silicon oxynitride); or silicon, oxygen, carbon, and hydrogen (e.g., in the form of tetraethyl orthosilicate (TEOS)); and combinations thereof. In some embodiments, the insulating material 106 of the interposer 150 includes an insulating metal oxide, such as aluminum and oxygen (e.g., in the form of aluminum oxide); titanium and oxygen (e.g., in the form of titanium oxide); hafnium and oxygen (e.g., in the form of hafnium oxide); zirconium and oxygen (e.g., in the form of zirconium oxide); niobium and oxygen (e.g., in the form of niobium oxide); or tantalum and oxygen (e.g., in the form of tantalum oxide); and combinations thereof. In some embodiments, the interposer 150 may be semiconductor-based (e.g., silicon-based) or glass-based. In some embodiments, the interposer 150 is a silicon wafer or die. In some embodiments, the interposer 150 may be a silicon-on-insulator (SOI) and may further include layers of silicon and germanium (e.g., in the form of silicon germanium), gallium and nitrogen (e.g., in the form of gallium nitride), indium and phosphorous (e.g., in the form of indium phosphide), among others. In some embodiments, the insulating material 106 of the interposer 150 may be an organic material, such as polyimide or polybenzoxazole, or may include an organic polymer matrix (e.g., epoxide) with a filler material (which may be inorganic, such as silicon nitride, silicon oxide, or aluminum oxide). In some such embodiments, the interposer 150 may be referred to as an "organic interposer." In some embodiments, the insulating material 106 of an interposer 150 may be provided in multiple layers of organic buildup film. Organic interposers 150 may be less expensive to manufacture than semiconductor- or glass-based interposers, and may have electrical performance advantages due to the low dielectric constants of organic insulating materials 106 and the thicker lines that may be used (allowing for improved power delivery, signaling, and potential thermal benefits). Organic interposers 150 may also have larger footprints than can be achieved for semiconductor-based interposers, which are limited by the size of the reticle used for patterning. Further, organic interposers 150 may be subject to less restrictive design rules than those that constrain semiconductor- or glass-based interposers, allowing for the use of design features such as non-Manhattan routing (e.g., not being restricted to using one layer for horizontal interconnects and another layer for vertical interconnects) and the avoidance of through-substrate vias (TSVs) such as through-silicon vias or through-glass vias (which may be limited in the achievable pitch, and may result in less desirable power delivery and signaling performance). Conventional integrated circuit packages including an organic interposer have been limited to solder-based attach technologies, which may have a lower limit on the achievable pitch that precludes the use of conventional solder-based interconnects to achieve the fine pitches desired for next generation devices. Utilizing an organic interposer 150 in a microelectronic assembly 100 with direct bonding, as disclosed herein, may leverage these advantages of organic interposers in combination with the ultra-fine pitch (e.g., the pitch 128 discussed below) achievable by direct bonding (and previously only achievable when using semiconductor-based interposers), and thus may support the design and fabrication of large and sophisticated die complexes that can achieve packaged system competition performance and capabilities not enabled by conventional approaches.

In other embodiments, the insulating material 106 of the interposer 150 may include a fire retardant grade 4 material (FR-4), bismaleimide triazine (BT) resin, or low-k or ultra low-k dielectric (e.g., carbon-doped dielectrics, fluorine-doped dielectrics, and porous dielectrics). When the interposer 150 is formed using standard printed circuit board (PCB) processes, the insulating material 106 may include FR-4, and the conductive pathways 112 in the interposer 150 may be formed by patterned sheets of copper separated by buildup layers of the FR-4. In some such embodiments, the interposer 150 may be referred to as a "package substrate" or a "circuit board."

In some embodiments, one or more of the conductive pathways 112 in the interposer 150 may extend between a conductive contact at the top surface of the interposer 150 (e.g., one of the DB contacts 110) and a conductive contact 118 at the bottom surface of the interposer 150. In some embodiments, one or more of the conductive pathways 112 in the interposer 150 may extend between different conductive contacts at the top surface of the interposer 150 (e.g., between different DB contacts 110 potentially in different DB regions 130, as discussed further below). In some embodiments, one or more of the conductive pathways 112 in the interposer 150 may extend between different conductive contacts 118 at the bottom surface of the interposer 150.

In some embodiments, an interposer 150 may only include conductive pathways 112, and may not contain active or passive circuitry. In other embodiments, an interposer 150 may include active or passive circuitry (e.g., transistors, diodes, resistors, inductors, and capacitors, among others). In some embodiments, an interposer 150 may include one or more device layers including transistors.

Although FIGS. 1 and 2 (and others of the accompanying drawings) illustrate a specific number and arrangement of conductive pathways 112 in the interposer 150, these are simply illustrative, and any suitable number and arrangement may be used. The conductive pathways 112 disclosed herein (e.g., including lines 114 and/or vias 116) may be formed of any appropriate conductive material, such as copper, silver, nickel, gold, aluminum, other metals or alloys, or combinations of materials, for example.

In some embodiments, a microelectronic component 102 may include an IC die (packaged or unpackaged) or a stack of an IC dies (e.g., a high-bandwidth memory dies stack). In some such embodiments, the insulating material of a microelectronic component 102 may include silicon dioxide, silicon nitride, oxynitride, polyimide materials, glass-reinforced epoxy matrix materials, or a low-k or ultra low-k dielectric (e.g., carbon-doped dielectrics, fluorine-doped dielectrics, porous dielectrics, organic polymeric dielectrics, photo-imageable dielectrics, and/or benzocyclobutene-based polymers). In some further embodiments, the insulating material of a microelectronic component 102 may include a semiconductor material, such as silicon, germanium, or a III-V material (e.g., gallium nitride), and one or more additional materials. For example, an insulating material of a microelectronic component 102 may include silicon oxide or silicon nitride. The conductive pathways in a microelectronic component 102 may include conductive lines and/or conductive vias, and may connect any of the conductive contacts in the microelectronic component 102 in any suitable manner (e.g., connecting multiple conductive contacts on a same surface or on different surfaces of the microelectronic component 102). Example structures that may be included in the microelectronic components 102 disclosed herein are discussed below with reference to FIG. 9. In particular, a microelectronic component 102 may include active and/or passive circuitry (e.g., transistors, diodes, resistors, inductors, and capacitors, among others). In some embodiments, a microelectronic component 102 may include one or more device layers including transistors. When a microelectronic component 102 includes active circuitry, power and/or ground signals may be routed through the interposer 150 and to/from a microelectronic component 102 through a DB region 130 (and further through intervening microelectronic components 102). In some embodiments, a microelectronic component 102 may take the form of any of the embodiments of the interposer 150 herein. Although the microelectronic components 102 of the microelectronic assembly 100 of FIG. 1 are single-sided components (in the sense that an individual microelectronic component 102 only has conductive contacts (e.g., DB contacts 110) on a single surface of the individual microelectronic component 102), in some embodiments, a microelectronic component 102 may be a double-sided (or "multi-level," or "omni-directional") component with conductive contacts on multiple surfaces of the component (e.g., microelectronic components 102-1, 102-2 of FIG. 3).

Additional components (not shown), such as surface-mount resistors, capacitors, and/or inductors, may be disposed on the top surface or the bottom surface of the interposer 150, or embedded in the interposer 150. The microelectronic assembly 100 of FIG. 1 also includes a support component 182 coupled to the interposer 150. In the particular embodiment of FIG. 1, the support component 182 includes conductive contacts 118 that are electrically coupled to complementary conductive contacts 118 of the interposer 150 by intervening solder 120 (e.g., solder balls in a ball grid array (BGA) arrangement), but any suitable interconnect structures may be used (e.g., pins in a pin grid array arrangement, lands in a land grid array arrangement, pillars, pads and pillars, etc.). The solder 120 utilized in the microelectronic assemblies 100 disclosed herein may include any suitable materials, such as lead/tin, tin/bismuth, eutectic tin/silver, ternary tin/silver/copper, eutectic tin/copper, tin/nickel/copper, tin/bismuth/copper, tin/indium/copper, tin/zinc/indium/bismuth, or other alloys. In some embodiments, the couplings between the interposer 150 and the support component 182 may be referred to as second-level interconnects (SLI) or multi-level interconnects (MLI).

In some embodiments, the support component 182 may be a package substrate (e.g., may be manufactured using PCB processes, as discussed above). In some embodiments, the support component 182 may be a circuit board (e.g., a motherboard), and may have other components attached to it (not shown). The support component 182 may include conductive pathways and other conductive contacts (not shown) for routing power, ground, and signals through the support component 182, as known in the art. In some embodiments, the support component 182 may include another IC package, an interposer, or any other suitable component. An underfill material 138 may be disposed around the solder 120 coupling the interposer 150 to the support component 182. In some embodiments, the underfill material 138 may include an epoxy material.

In some embodiments, the support component 182 may be a lower density component, while the interposer 150 and/or the microelectronic components 102 may be higher density components. As used herein, the term "lower density" and "higher density" are relative terms indicating that the conductive pathways (e.g., including conductive lines and conductive vias) in a lower density component are larger and/or have a greater pitch than the conductive pathways in a higher density component. In some embodiments, a microelectronic component 102 may be a higher density component, and an interposer 150 may be a lower density component. In some embodiments, a higher density component may be manufactured using a dual damascene or single damascene process (e.g., when the higher density component is a die), while a lower density component may be manufactured using a semi-additive or modified semi-additive process (with small vertical interconnect features formed by advanced laser or lithography processes) (e.g., when the lower density component is a package substrate or an interposer). In some other embodiments, a higher density component may be manufactured using a semi-additive or modified semi-additive process (e.g., when the higher density component is a package substrate or an interposer), while a lower density component may be manufactured using a semi-additive or a subtractive process (using etch chemistry to remove areas of unwanted metal, and with coarse vertical interconnect features formed by a standard laser process) (e.g., when the lower density component is a PCB).

The microelectronic assembly 100 of FIG. 1 may also include a mold material 126. The mold material 126 may extend around one or more of the microelectronic components 102 on the interposer 150. In some embodiments, the mold material 126 may extend between multiple microelectronic components 102 on the interposer 150 and around the DB regions 130. In some embodiments, the mold material 126 may extend above one or more of the microelectronic components 102 on an interposer 150 (not shown). The mold material 126 may be an insulating material, such as an appropriate epoxy material. The mold material 126 may be selected to have a coefficient of thermal expansion (CTE) that may mitigate or minimize the stress between the microelectronic components 102 and the interposer 150 arising from uneven thermal expansion in the microelectronic assembly 100. In some embodiments, the CTE of the mold material 126 may have a value that is intermediate to the CTE of the interposer 150 (e.g., the CTE of the insulating material 106 of the interposer 150) and a CTE of the microelectronic components 102. In some embodiments, the mold material 126 used in a microelectronic assembly 100 may be selected at least in part for its thermal properties. For example, one or more mold materials 126 used in a microelectronic assembly 100 may have low thermal conductivity (e.g., conventional mold compounds) to retard heat transfer, or may have high thermal conductivity (e.g., mold materials including metal or ceramic particles with high thermal conductivity, such as copper, silver, diamond, silicon carbide, aluminum nitride, and boron nitride, among others) to facilitate heat transfer. Any of the mold materials 126 referred to herein may include one or more different materials with different material compositions.

The microelectronic assembly 100 of FIG. 1 may also include a TIM 154. The TIM 154 may include a thermally conductive material (e.g., metal particles) in a polymer or other binder. The TIM 154 may be a thermal interface material paste or a thermally conductive epoxy (which may be a fluid when applied and may harden upon curing, as known in the art). The TIM 154 may provide a path for heat generated by the microelectronic components 102 to readily flow to the heat transfer structure 152, where it may be spread and/or dissipated. Some embodiments of the microelectronic assembly 100 of FIG. 1 may include a sputtered metallization (not shown) across the top surfaces of the mold material 126 and the microelectronic components 102; the TIM 154 (e.g., a solder TIM) may be disposed on this metallization.

The microelectronic assembly 100 of FIG. 1 may also include a heat transfer structure 152. The heat transfer structure 152 may be used to move heat away from one or more of the microelectronic components 102 (e.g., so that the heat may be more readily dissipated). The heat transfer structure 152 may include any suitable thermally conductive material (e.g., metal, appropriate ceramics, etc.), and may include any suitable features (e.g., a heat spreader, a heat sink including fins, a cold plate, etc.). In some embodiments, a heat transfer structure 152 may be or may include an integrated heat spreader (IHS).

The elements of a microelectronic assembly 100 may have any suitable dimensions. Only a subset of the accompanying drawings are labeled with reference numerals representing dimensions, but this is simply for clarity of illustration, and any of the microelectronic assemblies 100 disclosed herein may have components having the dimensions discussed herein. In some embodiments, the thickness 184 of the interposer 150 may be between 20 microns and 200 microns. In some embodiments, the thickness 188 of a DB region 130 may be between 50 nanometers and 5 microns. In some embodiments, a thickness 190 of a microelectronic component 102 may be between 5 microns and 800 microns. In some embodiments, a pitch 128 of the DB contacts 110 in a DB region 130 may be less than 20 microns (e.g., between 0.1 microns and 20 microns).

FIG. 3 is a side, cross-sectional view of a microelectronic assembly 100 including a void at the direct bonding regions, in accordance with various embodiments. FIG. 3 further illustrates the microelectronic component 102-3 coupled to the microelectronic component 102-1 by a DB region 130-3 and including voids 115-5, 115-6, and the microelectronic component 102-4 coupled to the microelectronic component 102-2 by a DB region 130-4 and including voids 115-7, 115-8, which include similar DB interfaces 180-3A and 180-3B and 180-4A and 180-4B, respectively. As shown in FIG. 3, the voids 115 may be in a single DB interface 180 (e.g., void 115-7 in DB interface 180-4A and void 115-8 in DB interface 180-4B), or may be in both DB interfaces 180 (e.g., voids 115-5, 115-6 in DB interfaces 180-3A and 180-3B). In some embodiments, the voids 115 may be designed reduce a total number of voids 115 by having the voids in both DB interfaces 180 (e.g., DB interfaces 180-3A and 180-3B), such that thinned DB contacts 110 of a microelectronic component 102 are mated to thinned DB contacts 110 of an other microelectronic component 102.

The footprints of the DB contacts 110 in a DB interface 180 may have any desired shape, and multiple DB contacts 110 may be arranged within a DB interface 180 in any desired manner (e.g., by the use of lithographic patterning techniques to form the DB contacts 110). For example, FIGS. 4A-4D are top views of various arrangements of DB contacts 110 in a DB dielectric 108 of a DB interface 180. In the embodiment of FIG. 4A, the DB contacts 110 have rectangular (e.g., square) footprints and are arranged in a rectangular array. In the embodiment of FIG. 4B, the DB contacts 110 have cross-shaped footprints and are arranged in a triangular array. In the embodiment of FIG. 4C, the DB contacts 110 are arranged in a rectangular array, and alternating rows of the DB contacts 110 have cross-shaped footprints and triangular footprints. In the embodiment of FIG. 4D, the DB contacts 110 are arranged in a rectangular array, the DB contacts 110 have circular footprints, and the diameters of the footprints of the DB contacts 110 vary in a checkerboard pattern. DB contacts 110 included in a DB interface 180 may have any suitable combination of these and other footprint shapes, sizes, and arrangements (e.g., hexagonal arrays, oval footprints, etc.). In some particular embodiments, DB contacts 110 in a DB interface 180 may have footprints shaped as convex polygons (e.g., squares, rectangles, octagons, cross shapes, etc.) or circles.

Any suitable techniques may be used to manufacture the microelectronic assemblies disclosed herein. FIGS. 5A-5G are side, cross-sectional views of various stages in an example process for manufacturing the microelectronic assembly of FIG. 1, in accordance with various embodiments. Although the operations discussed below with reference to FIGS. 5A-5G are illustrated in a particular order, these operations may be performed in any suitable order.

Figure 5A:
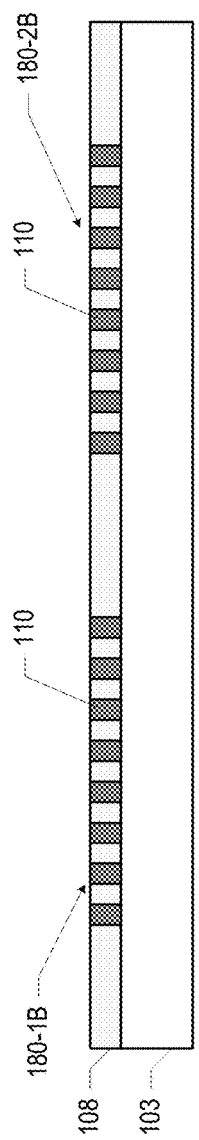
FIGS. 5A-5G are side, cross-sectional views of various stages in an example process for manufacturing the microelectronic assembly of FIG. 1, in accordance with various embodiments.

FIG. 5A illustrates a wafer 103 having two exposed DB interfaces 180-1B and 180-2B including DB dielectric 108 around DB contacts 110. The wafer 103 (e.g., wafer 1500 of FIG. 8) may be composed of any suitable material, such as semiconductor material, and may include one or more dies having IC structures formed on a surface of the wafer 103. The wafer may also be a reconstituted wafer consisting of multiple heterogeneous dies that are attached to a carrier substrate.

Figure 5B:
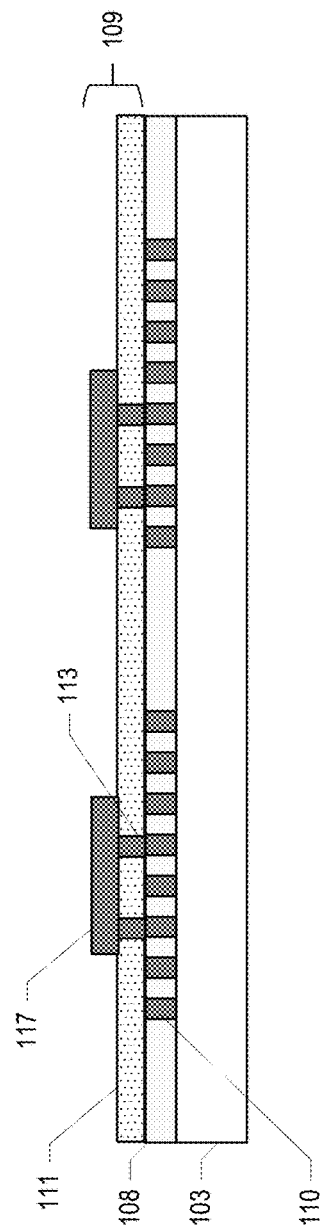

FIG. 5B illustrates an assembly subsequent to providing a sacrificial RDL 109 on a top surface (e.g., over the DB interfaces 180-1B, 180-2B) of the assembly of FIG. 5A. The RDL 109 may include an RDL test pad 117, an RDL dielectric material 111, and an RDL via 113 through the RDL dielectric material 111 coupling the RDL test pad 117 to one or more of the DB contacts 110. The RDL dielectric material 111 may be deposited using any suitable technique, including spin coating, chemical vapor deposition (CVD), or atomic layer deposition (ALD). In some embodiments, the locations of RDL vias 113 may be patterned in the RDL dielectric material 111 prior to the deposition of conductive material. The patterning may be performed using any suitable technique such as chemical etch or dry etch through a lithography mask. The RDL vias 113 and the RDL pads 117 may be formed of any suitable conductive material or combination of conductive materials, such as copper or a copper alloy. The RDL pads 117 may have any suitable shape, such as rectangular, triangular, circular, or hexagonal, and may have any suitable size, such as a length between 10 microns and 100 microns and a width between 10 microns and 100 microns. The RDL dielectric 111 may be formed of any suitable dielectric material, such as an organic dielectric materials (e.g. photoresist or FR4 material) or an inorganic dielectric material (e.g., silicon dioxide, silicon nitride, aluminum nitride or aluminum oxide). In some embodiments, the RDL dielectric 111 may be chosen based on properties that enable the RDL dielectric 111 to be readily removed as compared to the DB dielectric 108. In some embodiments, the top surface of the assembly of FIG. 5A (e.g., DB interfaces 180-1B, 180-2B) may be planarized, for example, using chemical and mechanical planarization techniques, prior to deposition of the RDL 109. In some embodiments, a etch stop layer (not shown) may be deposited prior to the RDL dielectric layer 111 to protect the DB dielectric 108 when the RDL 109 is selectively removed. The etch stop layer may include any suitable material such as aluminum and oxygen (e.g., in the form of aluminum oxide), aluminum and nitrogen (e.g., in the form of aluminum nitride), or silicon and nitrogen (e.g., in the form of silicon nitride). The assembly of FIG. 5B may undergo testing using standard probing techniques, and may be tested at the wafer level or after singulation at the singulated die level.

Figure 5C:
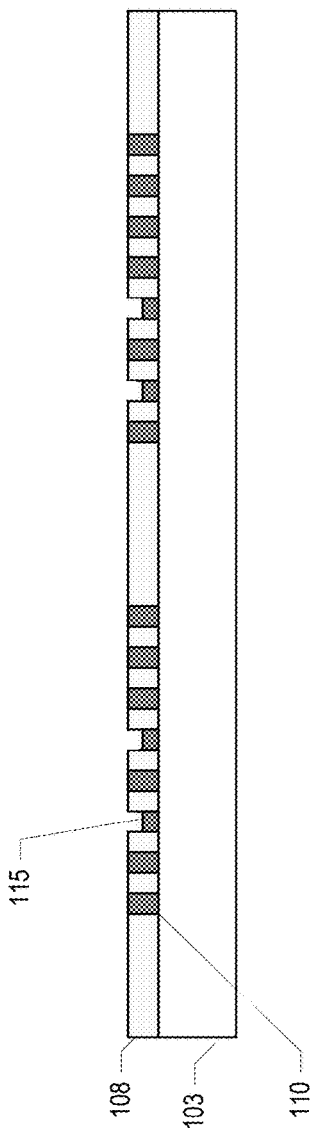

FIG. 5C illustrates an assembly subsequent to selectively removing the RDL 109 of the assembly FIG. 5B. In some embodiments, the RDL vias 113 and the RDL pads 117 may be removed first, and then the RDL dielectric 111 may be removed. The RDL vias 113 and the RDL pads 117 may be removed using any suitable technique, including dry etch, wet etch (e.g., chemical etch), or a combination of dry and wet etch. Although the RDL vias 113 and the RDL pads 117 are selectively removed, the DB contacts 110 that were coupled to the RDL vias 113 may be thinned or eroded (e.g., interface material of the DB contacts 110 will be etched and roughened) and may form voids 115. The RDL dielectric 111 may be removed using any suitable technique, including dry etch, wet etch, or reactive ion etch. In some embodiments, additional processing to clean the surface of the assembly 5C may be performed, such as additional planarization steps to improve the bond dielectric 108 surface planarity and roughness post sacrificial dielectric 111 removal. The sacrificial RDL 109 removal may be performed at the wafer level (e.g., before dicing the dies) as shown or may be performed after dicing the dies (e.g. after singulated die level testing).

Figure 5D:
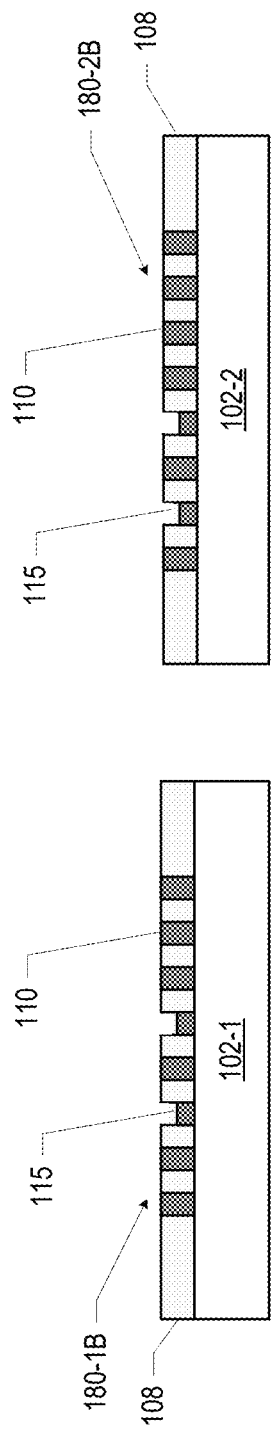

FIG. 5D illustrates assemblies subsequent to singulating microelectronic components 102 from the assembly of FIG. 5C (e.g., singulating dies from wafer 103). As shown in FIG. 5D, the microelectronic components 102-1, 102-2 include DB interfaces 180-1B, 180-2B, respectively, and further include voids 115.

Figure 5E:
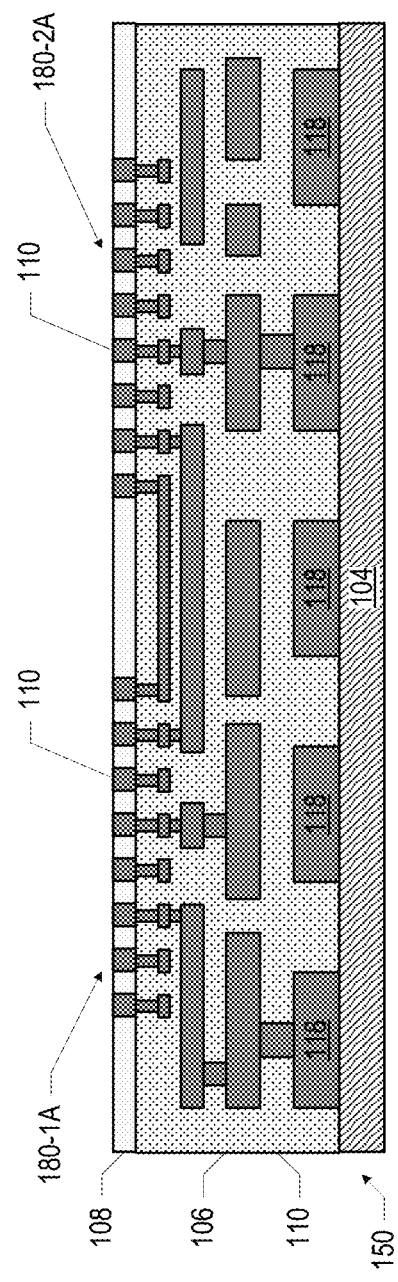

FIG. 5E illustrates an assembly including an interposer 150 mounted on a carrier 104. The interposer 150 includes two exposed DB interfaces 180-1A and 180-2A including DB contacts 110. The carrier 104 may include any suitable material, and in some embodiments, may include a semiconductor wafer (e.g., a silicon wafer) or glass (e.g., a glass panel). When the interposer 150 is an organic interposer, the interposer 150 may be advantageously manufactured on the carrier 104, which may provide a mechanically stable surface on which the layers of the interposer 150 may be formed.

Figure 5F:
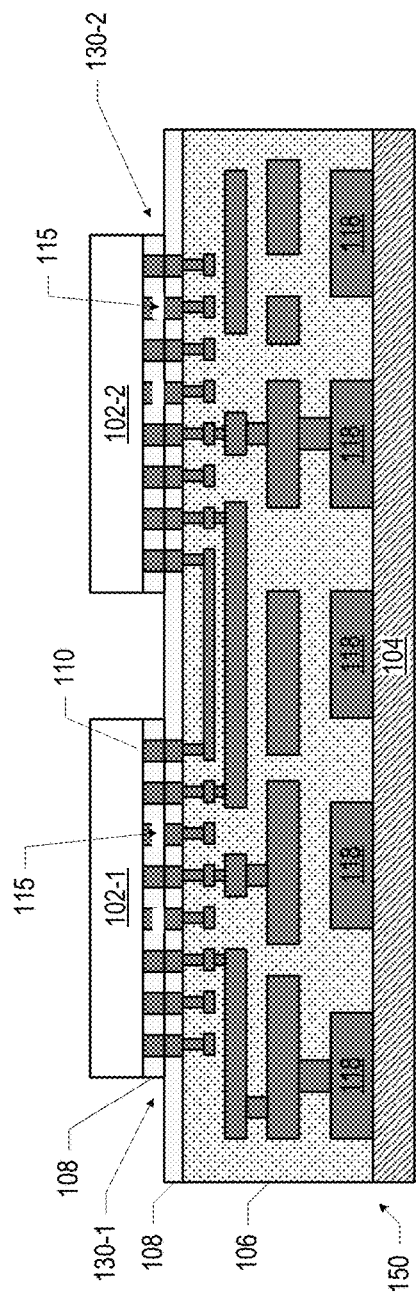

FIG. 5F illustrates an assembly subsequent to direct bonding microelectronic components 102-1 and 102-2 of FIG. 5D to the interposer 150/carrier 104 of FIG. 5E. In particular, DB interfaces 180 (not labeled) of the microelectronic components 102 may be brought into contact with the DB interfaces 180 of the interposer 150, and heat and/or pressure to be applied to bond the contacting DB interfaces 180 to form DB regions 130 (with DB regions 130-1 and 130-2 corresponding to the DB interfaces 180-1 and 180-2, respectively), where the DB regions 130-1 and 130-2 include voids 115.

Figure 5G:
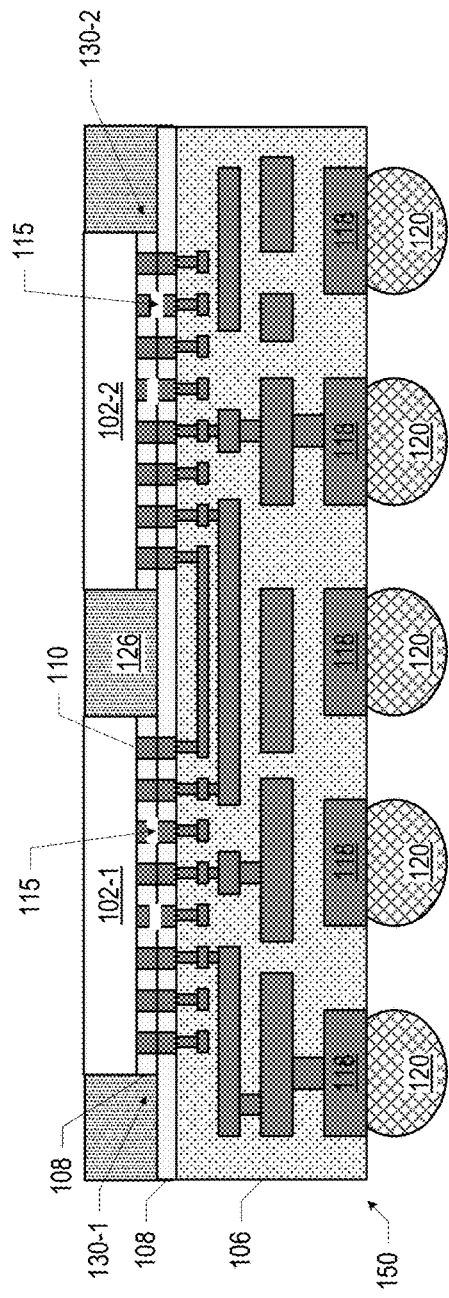

FIG. 5G illustrates an assembly subsequent to providing a mold material 126 around the microelectronic components 102 and on the surface of the interposer 150 of the assembly of FIG. 5F, removing the carrier 104, and providing solder 120 on the newly exposed conductive contacts 118. In some embodiments, the mold material 126 may extend above and remain above the microelectronic components 102, while in other embodiments, the mold material 126 may be polished back to expose the top surfaces of the microelectronic components 102, as shown. Further manufacturing operations may be performed on the microelectronic assembly 100 of FIG. 5G to form other microelectronic assemblies 100; for example, the solder 120 may be used to couple the microelectronic assembly 100 of FIG. 5G to a support component 182, and a TIM 154 and heat transfer structure 152 may be provided on the top surface of the microelectronic assembly 100 of FIG. 5G, similar to the microelectronic assembly 100 of FIG. 1. Although FIG. 5 illustrates deposition of the RDL 109 at the wafer level, the RDL 109 may be deposited at any level, including the single die level or the panel level.

Microelectronic assemblies 100 including multiple tiers of microelectronic components 102 may be formed in a manner discussed above with reference to FIGS. 5A-5G, with the additional tiers of microelectronic components 102 (e.g., microelectronic components 102-3, 102-4 of FIG. 3) coupled to the preceding assemblies prior to deposition of the mold material 126. In some other embodiments, a microelectronic assembly 100 including multiple tiers of microelectronic components 102 may be formed by first assembling the tiers of microelectronic components 102, and then coupling the assembled tiers to an interposer 150. A microelectronic assembly 100 may not be limited to two tiers of microelectronic components 102, but may include three or more tiers, as desired. Further, although the microelectronic components 102 in an individual tier in FIG. 3 are depicted as having a same height, this is simply for ease of illustration, and microelectronic components 102 in any individual tier in a microelectronic assembly 100 may have different heights. Further, not every microelectronic component 102 in a microelectronic assembly 100 may be part of a stack of multiple microelectronic components 102; for example, in some variants of the microelectronic assembly 100 of FIG. 3, no microelectronic component 102-4 may be present on top of the microelectronic component 102-2.

Figure 6A:
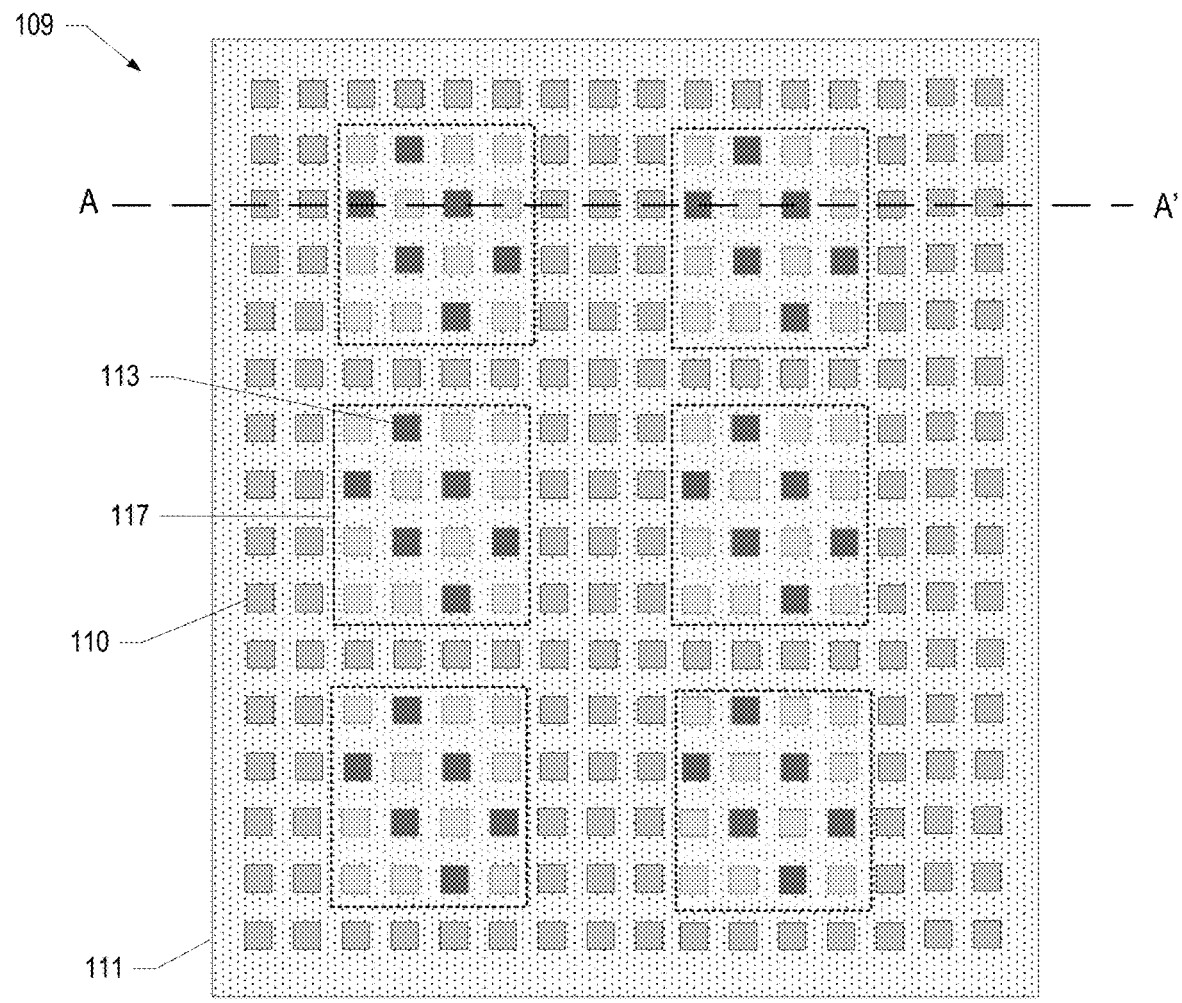
FIG. 6A is a top view of an example arrangement of direct bonding testing structures, in accordance with various embodiments.
Figure 6B:
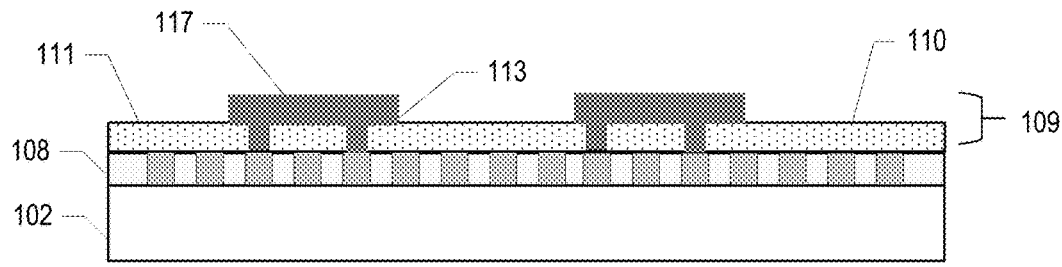
FIGS. 6B-6C are side cross-sectional views along the A-A' line of FIG. 6A, in accordance with various embodiments.
Figure 6C:
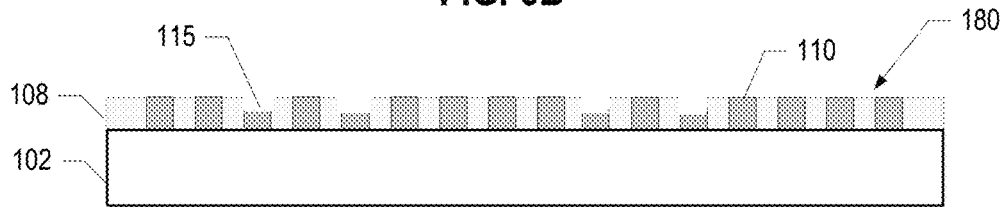

FIGS. 6A-6C are top view and side view schematics showing an example arrangement of a sacrificial RDL for testing microelectronic components, however, this arrangement is simply exemplary, and any suitable arrangement may be used. FIG. 6A is a top view of the example arrangement including DB contacts 110, an RDL dielectric 111, RDL vias 113, and RDL pads 117. FIG. 6A shows two-hundred and fifty-six DB contacts 110 arranged in a sixteen by sixteen array, six RDL pads 117, and each individual RDL pad 117 including six RDL vias 113. Although FIG. 6A illustrates the DB contacts 110 as having a rectangular shape and being arranged in a rectangular array, the DB contacts 110 may have any suitable shape (e.g., as described above with reference to FIG. 4) and may be arranged in any suitable pattern (e.g., triangular, hexagonal, rectangular, etc.). Although FIG. 6A shows RDL pads 117 having a same rectangular shape, size, and number of RDL vias 113 (e.g., each RDL pad 117 covers an area of sixteen DB contacts 110 and has six RDL vias 113), the RDL pads 117 may have any suitable shape, size, and number of RDL vias 113. In some embodiments, one or more of the RDL pads 117 may have a different shape, a different size, and/or a different number of RDL vias 113. As described above with reference to FIG. 1 and as shown in FIG. 6, the voids 115 (e.g., as represented by the RDL vias 113) may be arranged in a repetitive pattern and/or may be uniformly distributed. FIG. 6B is a side cross-sectional view along the A-A' line of FIG. 6A illustrating a DB dielectric 108 around DB contacts 110 on a microelectronic component 102 and an RDL 109 including an RDL dielectric 111 and two RDL pads 117, each RDL pad 117 having two RDL vias 113. An individual RDL via 113 is coupled to a respective individual DB contact 110. FIG. 6C illustrates the side cross-sectional view of FIG. 6B subsequent to the removal of the RDL 109.

As shown in FIG. 6C, the DB interface 180 includes thinned DB contacts 110 where voids 115 may be formed.

Figure 7A:
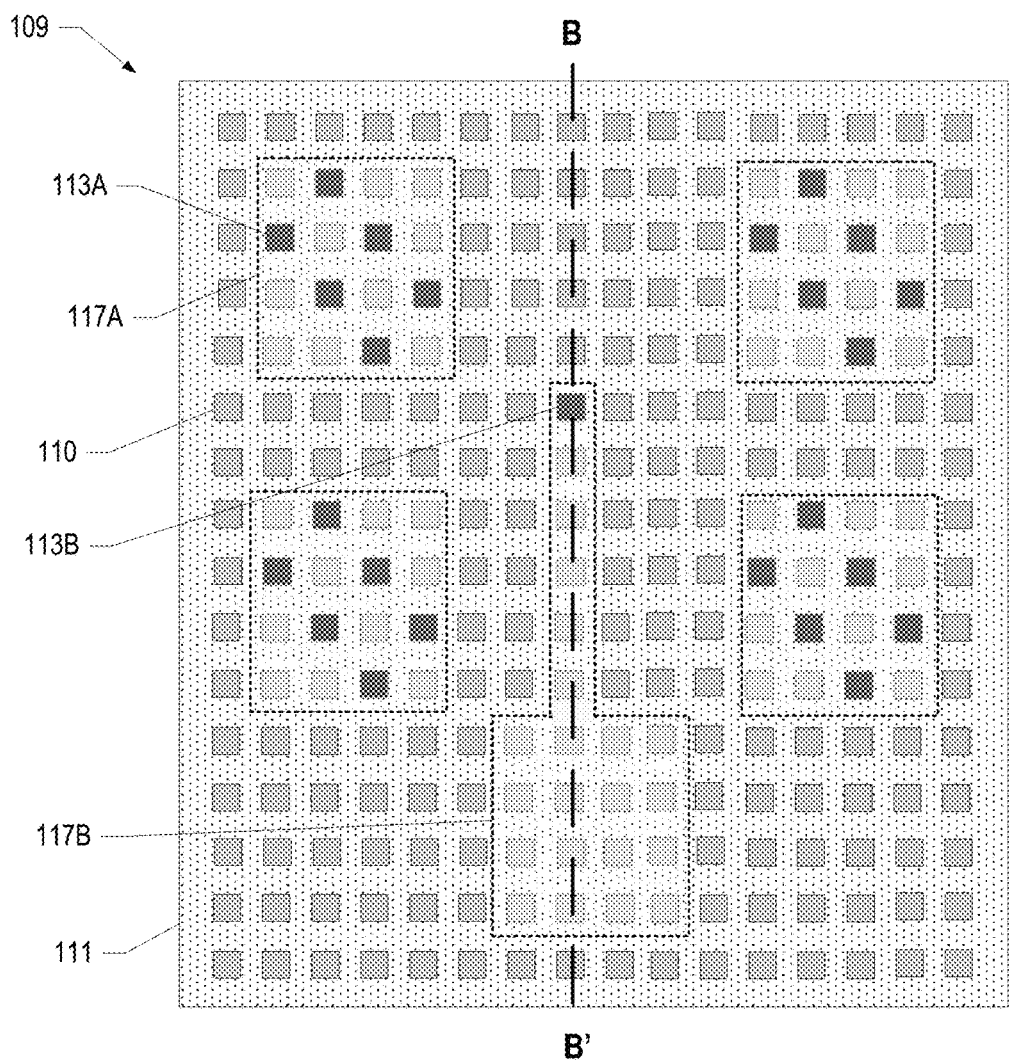
FIG. 7A is a top view of an example arrangement of direct bonding testing structures, in accordance with various embodiments.
Figure 7B:
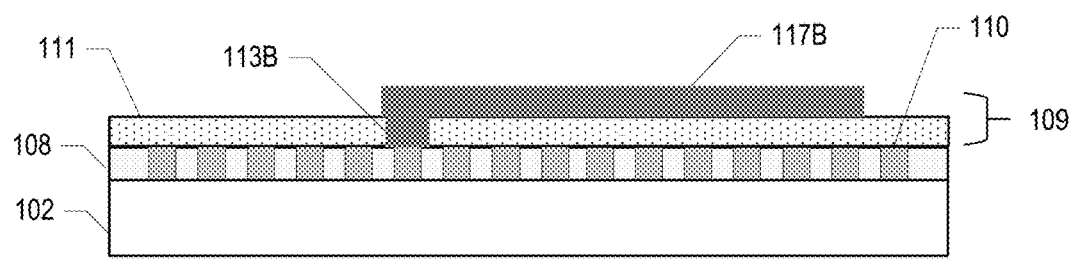
FIGS. 7B-7C are side cross-sectional views along the B-B' line of FIG. 7A, in accordance with various embodiments.
Figure 7C:
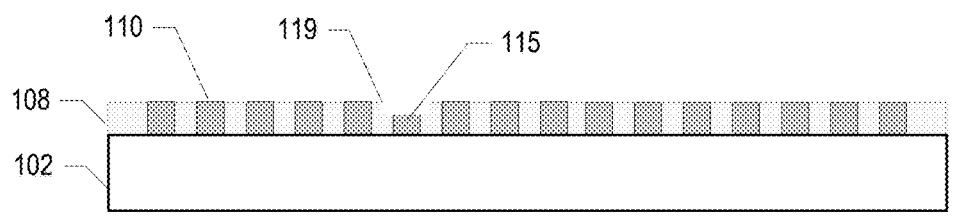

FIGS. 7A-7C are top view and side view schematics showing an example arrangement of a sacrificial RDL for testing microelectronic components, however, this arrangement is simply exemplary, and any suitable arrangement may be used. FIG. 7A is a top view of the example arrangement including sixty-four DB contacts 110, an RDL dielectric 111, seven RDL pads 117, and a plurality of RDL vias 113. FIG. 7A shows six RDL pads 117A having a same rectangular shape, where each individual RDL pad 117A has six RDL vias 113A, and one RDL pad 117B having a fanout shape with one RDL via 113B. As described above with reference to FIG. 1 and as shown in FIG. 7, the voids 115 (e.g., as represented by the RDL vias 113) may be arranged to be more concentrated along an edge or a perimeter area relative to an inner area. FIG. 7B is a side cross-sectional view along the B-B' line of FIG. 7A illustrating a DB dielectric 108 around DB contacts 110 on a microelectronic component 102 and an RDL 109 including an RDL dielectric 111 and an RDL pad 117B having an extended portion (e.g., a fanout shape), where the RDL pad 117B includes an RDL via 113B having a width that is greater than a width of the DB contact 110. The RDL via 113B is coupled to a respective individual DB contact 110. FIG. 7C illustrates the side cross-sectional view of FIG. 7B subsequent to the removal of the RDL 109. As shown in FIG. 7C, the DB interface 180 includes thinned DB contact 110 and a thinned DB dielectric 108 adjacent to the thinned DB contact 108 where a first void 115 may be formed between mated DB contacts 110 and a second void 119 may be formed in the DB dielectric 108 adjacent to the thinned DB contact 110.

The microelectronic components 102 and microelectronic assemblies 100 disclosed herein may be included in any suitable electronic component. FIGS. 8-11 illustrate various examples of apparatuses that may include, or be included in, as suitable, any of the microelectronic components 102 and microelectronic assemblies 100 disclosed herein.

Figure 8:
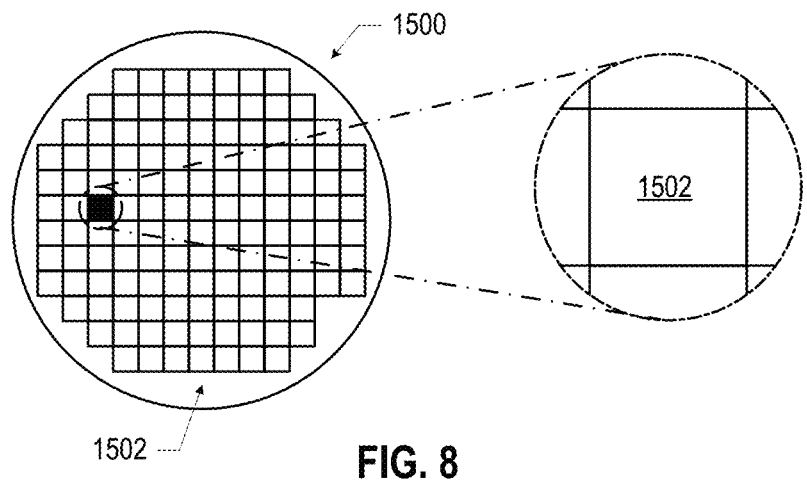
FIG. 8 is a top view of a wafer and dies that may be included in a microelectronic assembly, in accordance with any of the embodiments disclosed herein.

FIG. 8 is a top view of a wafer 1500 and dies 1502 that may be included in any of the microelectronic components 102 disclosed herein. For example, a die 1502 may serve as a microelectronic component 102, or may be included in a microelectronic component 102. The wafer 1500 may be composed of semiconductor material and may include one or more dies 1502 having IC structures formed on a surface of the wafer 1500. Each of the dies 1502 may be a repeating unit of a semiconductor product that includes any suitable IC. After the fabrication of the semiconductor product is complete, the wafer 1500 may undergo a singulation process in which the dies 1502 are separated from one another to provide discrete "chips" of the semiconductor product. The die 1502 may include one or more transistors (e.g., some of the transistors 1640 of FIG. 9, discussed below) and/or supporting circuitry to route electrical signals to the transistors, as well as any other IC components. In some embodiments, the wafer 1500 or the die 1502 may include a memory device (e.g., a random access memory (RAM) device, such as a static RAM (SRAM) device, a magnetic RAM (MRAM) device, a resistive RAM (RRAM) device, a conductive-bridging RAM (CBRAM) device, etc.), a logic device (e.g., an AND, OR, NAND, or NOR gate), or any other suitable circuit element. Multiple ones of these devices may be combined on a single die 1502. For example, a memory array formed by multiple memory devices may be formed on a same die 1502 as a processing device (e.g., the processing device 1802 of FIG. 11) or other logic that is configured to store information in the memory devices or execute instructions stored in the memory array.

Figure 9:
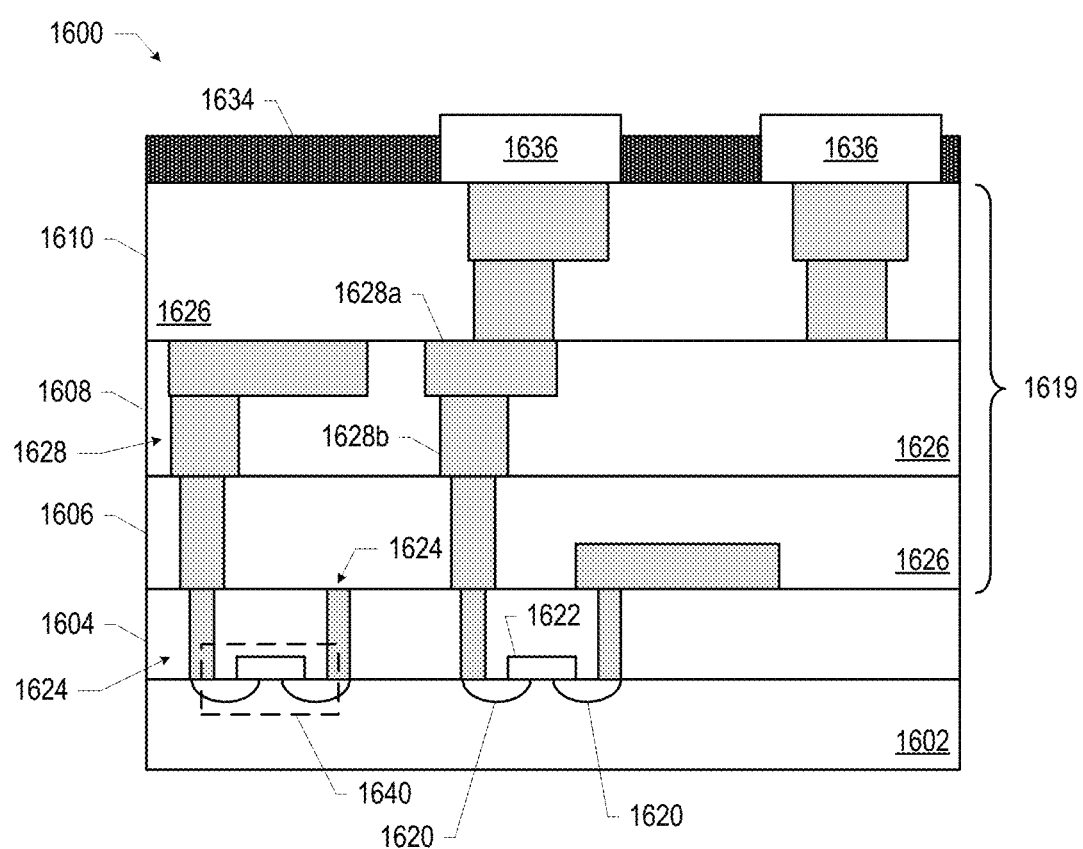
FIG. 9 is a cross-sectional side view of an IC device that may be included in a microelectronic assembly, in accordance with any of the embodiments disclosed herein.

FIG. 9 is a side, cross-sectional view of an IC device 1600 that may be included in any of the microelectronic components 102 disclosed herein. For example, an IC device 1600 (e.g., as part of a die 1502, as discussed above with reference to FIG. 8) may serve as a microelectronic component 102, or may be included in a microelectronic component 102. One or more of the IC devices 1600 may be included in one or more dies 1502 (FIG. 8). The IC device 1600 may be formed on a substrate 1602 (e.g., the wafer 1500 of FIG. 8) and may be included in a die (e.g., the die 1502 of FIG. 8). The substrate 1602 may be a semiconductor substrate composed of semiconductor material systems including, for example, n-type or p-type materials systems (or a combination of both). The substrate 1602 may include, for example, a crystalline substrate formed using a bulk silicon or a silicon-on-insulator (SOI) substructure. In some embodiments, the substrate 1602 may be formed using alternative materials, which may or may not be combined with silicon, that include but are not limited to germanium, indium antimonide, lead telluride, indium arsenide, indium phosphide, gallium arsenide, or gallium antimonide. Further materials classified as group II-VI, III-V, or IV may also be used to form the substrate 1602. Although a few examples of materials from which the substrate 1602 may be formed are described here, any material that may serve as a foundation for an IC device 1600 may be used. The substrate 1602 may be part of a singulated die (e.g., the dies 1502 of FIG. 8) or a wafer (e.g., the wafer 1500 of FIG. 8).

The IC device 1600 may include one or more device layers 1604 disposed on the substrate 1602. The device layer 1604 may include features of one or more transistors 1640 (e.g., metal oxide semiconductor field-effect transistors (MOSFETs)) formed on the substrate 1602. The device layer 1604 may include, for example, one or more source and/or drain (S/D) regions 1620, a gate 1622 to control current flow in the transistors 1640 between the S/D regions 1620, and one or more S/D contacts 1624 to route electrical signals to/from the S/D regions 1620. The transistors 1640 may include additional features not depicted for the sake of clarity, such as device isolation regions, gate contacts, and the like. The transistors 1640 are not limited to the type and configuration depicted in FIG. 9 and may include a wide variety of other types and configurations such as, for example, planar transistors, non-planar transistors, or a combination of both. Planar transistors may include bipolar junction transistors (BJT), heterojunction bipolar transistors (HBT), or high-electron-mobility transistors (HEMT). Non-planar transistors may include FinFET transistors, such as double-gate transistors or tri-gate transistors, and wrap-around or all-around gate transistors, such as nanoribbon and nanowire transistors.

Each transistor 1640 may include a gate 1622 formed of at least two layers, a gate dielectric and a gate electrode. The gate dielectric may include one layer or a stack of layers. The one or more layers may include silicon oxide, silicon dioxide, silicon carbide, and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric to improve its quality when a high-k material is used.

The gate electrode may be formed on the gate dielectric and may include at least one p-type work function metal or n-type work function metal, depending on whether the transistor 1640 is to be a p-type metal oxide semiconductor (PMOS) or an n-type metal oxide semiconductor (NMOS) transistor. In some implementations, the gate electrode may consist of a stack of two or more metal layers, where one or more metal layers are work function metal layers and at least one metal layer is a fill metal layer. Further metal layers may be included for other purposes, such as a barrier layer. For a PMOS transistor, metals that may be used for the gate electrode include, but are not limited to, ruthenium, palladium, platinum, cobalt, nickel, conductive metal oxides (e.g., ruthenium oxide), and any of the metals discussed below with reference to an NMOS transistor (e.g., for work function tuning). For an NMOS transistor, metals that may be used for the gate electrode include, but are not limited to, hafnium, zirconium, titanium, tantalum, aluminum, alloys of these metals, carbides of these metals (e.g., hafnium carbide, zirconium carbide, titanium carbide, tantalum carbide, and aluminum carbide), and any of the metals discussed above with reference to a PMOS transistor (e.g., for work function tuning).

In some embodiments, when viewed as a cross-section of the transistor 1640 along the source-channel-drain direction, the gate electrode may consist of a U-shaped structure that includes a bottom portion substantially parallel to the surface of the substrate and two sidewall portions that are substantially perpendicular to the top surface of the substrate. In other embodiments, at least one of the metal layers that form the gate electrode may simply be a planar layer that is substantially parallel to the top surface of the substrate and does not include sidewall portions substantially perpendicular to the top surface of the substrate. In other embodiments, the gate electrode may consist of a combination of U-shaped structures and planar, non-U-shaped structures. For example, the gate electrode may consist of one or more U-shaped metal layers formed atop one or more planar, non-U-shaped layers.

In some embodiments, a pair of sidewall spacers may be formed on opposing sides of the gate stack to bracket the gate stack. The sidewall spacers may be formed from materials such as silicon nitride, silicon oxide, silicon carbide, silicon nitride doped with carbon, and silicon oxynitride. Processes for forming sidewall spacers are well known in the art and generally include deposition and etching process steps. In some embodiments, a plurality of spacer pairs may be used; for instance, two pairs, three pairs, or four pairs of sidewall spacers may be formed on opposing sides of the gate stack.

The S/D regions 1620 may be formed within the substrate 1602 adjacent to the gate 1622 of each transistor 1640. The S/D regions 1620 may be formed using an implantation/diffusion process or an etching/deposition process, for example. In the former process, dopants such as boron, aluminum, antimony, phosphorous, or arsenic may be ion-implanted into the substrate 1602 to form the S/D regions 1620. An annealing process that activates the dopants and causes them to diffuse farther into the substrate 1602 may follow the ion-implantation process. In the latter process, the substrate 1602 may first be etched to form recesses at the locations of the S/D regions 1620. An epitaxial deposition process may then be carried out to fill the recesses with material that is used to fabricate the S/D regions 1620. In some implementations, the S/D regions 1620 may be fabricated using a silicon alloy such as silicon germanium or silicon carbide. In some embodiments, the epitaxially deposited silicon alloy may be doped in situ with dopants such as boron, arsenic, or phosphorous. In some embodiments, the S/D regions 1620 may be formed using one or more alternate semiconductor materials such as germanium or a group III-V material or alloy. In further embodiments, one or more layers of metal and/or metal alloys may be used to form the S/D regions 1620.

Electrical signals, such as power and/or input/output (I/O) signals, may be routed to and/or from the devices (e.g., the transistors 1640) of the device layer 1604 through one or more interconnect layers disposed on the device layer 1604 (illustrated in FIG. 9 as interconnect layers 1606-1610). For example, electrically conductive features of the device layer 1604 (e.g., the gate 1622 and the S/D contacts 1624) may be electrically coupled with the interconnect structures 1628 of the interconnect layers 1606-1610. The one or more interconnect layers 1606-1610 may form a metallization stack (also referred to as an "ILD stack") 1619 of the IC device 1600.

The interconnect structures 1628 may be arranged within the interconnect layers 1606-1610 to route electrical signals according to a wide variety of designs (in particular, the arrangement is not limited to the particular configuration of interconnect structures 1628 depicted in FIG. 9). Although a particular number of interconnect layers 1606-1610 is depicted in FIG. 9, embodiments of the present disclosure include IC devices having more or fewer interconnect layers than depicted.

In some embodiments, the interconnect structures 1628 may include lines 1628*a* and/or vias 1628*b* filled with an electrically conductive material such as a metal. The lines 1628*a* may be arranged to route electrical signals in a direction of a plane that is substantially parallel with a surface of the substrate 1602 upon which the device layer 1604 is formed. For example, the lines 1628*a* may route electrical signals in a direction in and out of the page from the perspective of FIG. 9. The vias 1628*b* may be arranged to route electrical signals in a direction of a plane that is substantially perpendicular to the surface of the substrate 1602 upon which the device layer 1604 is formed. In some embodiments, the vias 1628*b* may electrically couple lines 1628*a* of different interconnect layers 1606-1610 together.

The interconnect layers 1606-1610 may include a dielectric material 1626 disposed between the interconnect structures 1628, as shown in FIG. 9. In some embodiments, the dielectric material 1626 disposed between the interconnect structures 1628 in different ones of the interconnect layers 1606-1610 may have different compositions; in other embodiments, the composition of the dielectric material 1626 between different interconnect layers 1606-1610 may be the same.

A first interconnect layer 1606 may be formed above the device layer 1604. In some embodiments, the first interconnect layer 1606 may include lines 1628*a* and/or vias 1628*b*, as shown. The lines 1628*a* of the first interconnect layer 1606 may be coupled with contacts (e.g., the S/D contacts 1624) of the device layer 1604.

A second interconnect layer 1608 may be formed above the first interconnect layer 1606. In some embodiments, the second interconnect layer 1608 may include vias 1628*b* to couple the lines 1628*a* of the second interconnect layer 1608 with the lines 1628*a* of the first interconnect layer 1606.

Although the lines 1628a and the vias 1628b are structurally delineated with a line within each interconnect layer (e.g., within the second interconnect layer 1608) for the sake of clarity, the lines 1628a and the vias 1628b may be structurally and/or materially contiguous (e.g., simultaneously filled during a dual-damascene process) in some embodiments.

A third interconnect layer 1610 (and additional interconnect layers, as desired) may be formed in succession on the second interconnect layer 1608 according to similar techniques and configurations described in connection with the second interconnect layer 1608 or the first interconnect layer 1606. In some embodiments, the interconnect layers that are "higher up" in the metallization stack 1619 in the IC device 1600 (i.e., farther away from the device layer 1604) may be thicker.

The IC device 1600 may include a solder resist material 1634 (e.g., polyimide or similar material) and one or more conductive contacts 1636 formed on the interconnect layers 1606-1610. In FIG. 9, the conductive contacts 1636 are illustrated as taking the form of bond pads. The conductive contacts 1636 may be electrically coupled with the interconnect structures 1628 and configured to route the electrical signals of the transistor(s) 1640 to other external devices. For example, solder bonds may be formed on the one or more conductive contacts 1636 to mechanically and/or electrically couple a chip including the IC device 1600 with another component (e.g., a circuit board). The IC device 1600 may include additional or alternate structures to route the electrical signals from the interconnect layers 1606-1610; for example, the conductive contacts 1636 may include other analogous features (e.g., posts) that route the electrical signals to external components.

Figure 10:
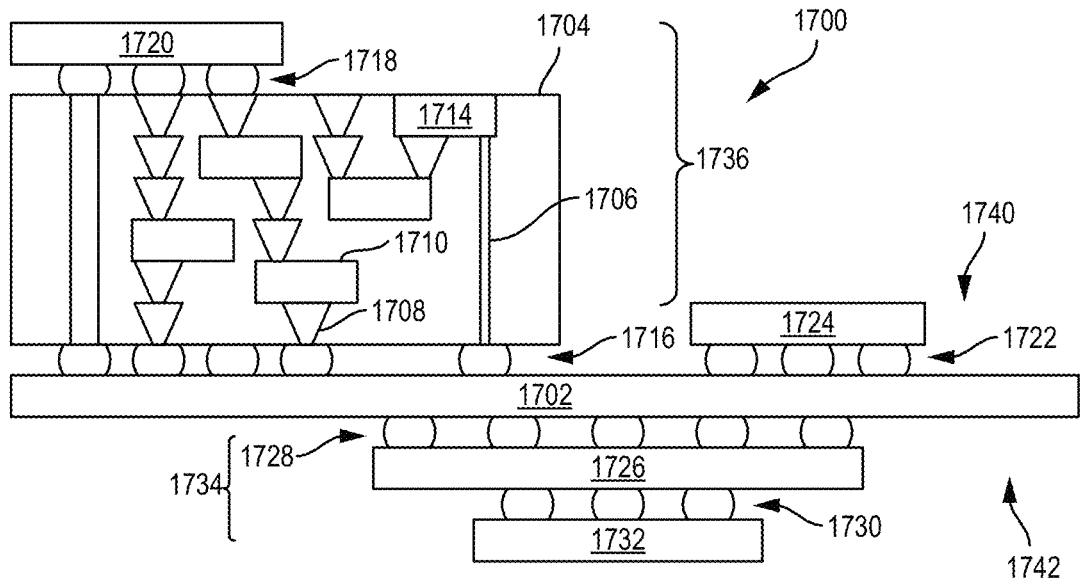
FIG. 10 is a cross-sectional side view of an IC device assembly that may include a microelectronic assembly, in accordance with any of the embodiments disclosed herein.

FIG. 10 is a side, cross-sectional view of an IC device assembly 1700 that may include any of the microelectronic components 102 and/or microelectronic assemblies 100 disclosed herein. The IC device assembly 1700 includes a number of components disposed on a circuit board 1702 (which may be, e.g., a motherboard). The IC device assembly 1700 includes components disposed on a first face 1740 of the circuit board 1702 and an opposing second face 1742 of the circuit board 1702; generally, components may be disposed on one or both faces 1740 and 1742. Any of the IC packages discussed below with reference to the IC device assembly 1700 may include any of the embodiments of the microelectronic assemblies 100 disclosed herein (e.g., may include multiple microelectronic components 102 coupled together by direct bonding).

In some embodiments, the circuit board 1702 may be a PCB including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 1702. In other embodiments, the circuit board 1702 may be a non-PCB substrate.

The IC device assembly 1700 illustrated in FIG. 10 includes a package-on-interposer structure 1736 coupled to the first face 1740 of the circuit board 1702 by coupling components 1716. The coupling components 1716 may electrically and mechanically couple the package-on-interposer structure 1736 to the circuit board 1702, and may include solder balls (as shown in FIG. 10), male and female portions of a socket, an adhesive, an underfill material, and/or any other suitable electrical and/or mechanical coupling structure.

The package-on-interposer structure 1736 may include an IC package 1720 coupled to a package interposer 1704 by coupling components 1718. The coupling components 1718 may take any suitable form for the application, such as the forms discussed above with reference to the coupling components 1716. Although a single IC package 1720 is shown in FIG. 10, multiple IC packages may be coupled to the package interposer 1704; indeed, additional interposers may be coupled to the package interposer 1704. The package interposer 1704 may provide an intervening substrate used to bridge the circuit board 1702 and the IC package 1720. The IC package 1720 may be or include, for example, a die (the die 1502 of FIG. 8), an IC device (e.g., the IC device 1600 of FIG. 9), or any other suitable component. Generally, the package interposer 1704 may spread a connection to a wider pitch or reroute a connection to a different connection. For example, the package interposer 1704 may couple the IC package 1720 (e.g., a die) to a set of BGA conductive contacts of the coupling components 1716 for coupling to the circuit board 1702. In the embodiment illustrated in FIG. 10, the IC package 1720 and the circuit board 1702 are attached to opposing sides of the package interposer 1704; in other embodiments, the IC package 1720 and the circuit board 1702 may be attached to a same side of the package interposer 1704. In some embodiments, three or more components may be interconnected by way of the package interposer 1704.

In some embodiments, the package interposer 1704 may be formed as a PCB, including multiple metal layers separated from one another by layers of dielectric material and interconnected by electrically conductive vias. In some embodiments, the package interposer 1704 may be formed of an epoxy resin, a fiberglass-reinforced epoxy resin, an epoxy resin with inorganic fillers, a ceramic material, or a polymer material such as polyimide. In some embodiments, the package interposer 1704 may be formed of alternate rigid or flexible materials that may include the same materials described above for use in a semiconductor substrate, such as silicon, germanium, and other group III-V and group IV materials. The package interposer 1704 may include metal lines 1710 and vias 1708, including but not limited to TSVs 1706. The package interposer 1704 may further include embedded devices 1714, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as radio frequency devices, power amplifiers, power management devices, antennas, arrays, sensors, and microelectromechanical systems (MEMS) devices may also be formed on the package interposer 1704. The package-on-interposer structure 1736 may take the form of any of the package-on-interposer structures known in the art.

The IC device assembly 1700 may include an IC package 1724 coupled to the first face 1740 of the circuit board 1702 by coupling components 1722. The coupling components 1722 may take the form of any of the embodiments discussed above with reference to the coupling components 1716, and the IC package 1724 may take the form of any of the embodiments discussed above with reference to the IC package 1720.

The IC device assembly 1700 illustrated in FIG. 10 includes a package-on-package structure 1734 coupled to the second face 1742 of the circuit board 1702 by coupling components 1728. The package-on-package structure 1734 may include an IC package 1726 and an IC package 1732 coupled together by coupling components 1730 such that the IC package 1726 is disposed between the circuit board 1702 and the IC package 1732. The coupling components 1728 and 1730 may take the form of any of the embodiments of the coupling components 1716 discussed above, and the IC packages 1726 and 1732 may take the form of any of the embodiments of the IC package 1720 discussed above. The package-on-package structure 1734 may be configured in accordance with any of the package-on-package structures known in the art.

Figure 11:
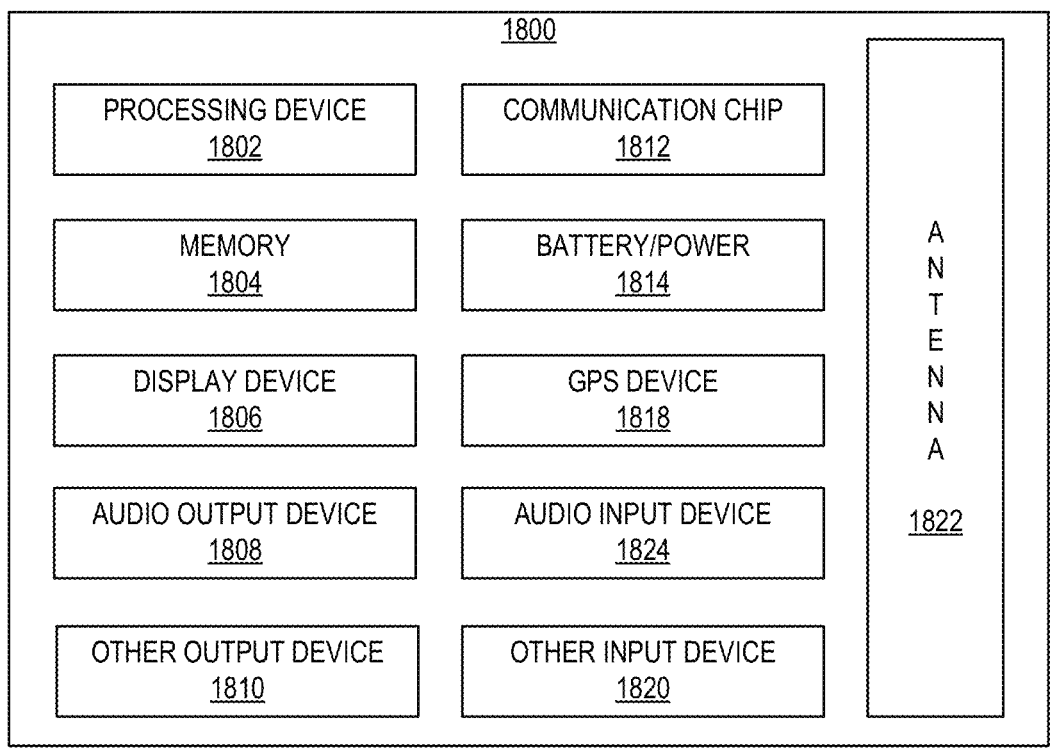
FIG. 11 is a block diagram of an example electrical device that may include a microelectronic assembly, in accordance with any of the embodiments disclosed herein.

FIG. 11 is a block diagram of an example electrical device 1800 that may include any of the microelectronic components 102 and/or microelectronic assemblies 100 disclosed herein. For example, any suitable ones of the components of the electrical device 1800 may include one or more of the IC device assemblies 1700, IC devices 1600, or dies 1502 disclosed herein. A number of components are illustrated in FIG. 11 as included in the electrical device 1800, but any one or more of these components may be omitted or duplicated, as suitable for the application. In some embodiments, some or all of the components included in the electrical device 1800 may be attached to one or more motherboards. In some embodiments, some or all of these components are fabricated onto a single system-on-a-chip (SoC) die.

Additionally, in various embodiments, the electrical device 1800 may not include one or more of the components illustrated in FIG. 11, but the electrical device 1800 may include interface circuitry for coupling to the one or more components. For example, the electrical device 1800 may not include a display device 1806, but may include display device interface circuitry (e.g., a connector and driver circuitry) to which a display device 1806 may be coupled. In another set of examples, the electrical device 1800 may not include an audio input device 1824 or an audio output device 1808, but may include audio input or output device interface circuitry (e.g., connectors and supporting circuitry) to which an audio input device 1824 or audio output device 1808 may be coupled.

The electrical device 1800 may include a processing device 1802 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 1802 may include one or more digital signal processors (DSPs), application-specific integrated circuits (ASICs), central processing units (CPUs), graphics processing units (GPUs), cryptoprocessors (specialized processors that execute cryptographic algorithms within hardware), server processors, or any other suitable processing devices. The electrical device 1800 may include a memory 1804, which may itself include one or more memory devices such as volatile memory (e.g., dynamic random access memory (DRAM)), nonvolatile memory (e.g., read-only memory (ROM)), flash memory, solid state memory, and/or a hard drive. In some embodiments, the memory 1804 may include memory that shares a die with the processing device 1802. This memory may be used as cache memory and may include embedded dynamic random access memory (eDRAM) or spin transfer torque magnetic random access memory (STT-MRAM).

In some embodiments, the electrical device 1800 may include a communication chip 1812 (e.g., one or more communication chips). For example, the communication chip 1812 may be configured for managing wireless communications for the transfer of data to and from the electrical device 1800. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

The communication chip 1812 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 1812 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 1812 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 1812 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 1812 may operate in accordance with other wireless protocols in other embodiments. The electrical device 1800 may include an antenna 1822 to facilitate wireless communications and/or to receive other wireless communications (such as AM or FM radio transmissions).

In some embodiments, the communication chip 1812 may manage wired communications, such as electrical, optical, or any other suitable communication protocols (e.g., the Ethernet). As noted above, the communication chip 1812 may include multiple communication chips. For instance, a first communication chip 1812 may be dedicated to shorter-range wireless communications such as Wi-Fi or Bluetooth, and a second communication chip 1812 may be dedicated to longer-range wireless communications such as global positioning system (GPS), EDGE, GPRS, CDMA, WiMAX, LTE, EV-DO, or others. In some embodiments, a first communication chip 1812 may be dedicated to wireless communications, and a second communication chip 1812 may be dedicated to wired communications.

The electrical device 1800 may include battery/power circuitry 1814. The battery/power circuitry 1814 may include one or more energy storage devices (e.g., batteries or capacitors) and/or circuitry for coupling components of the electrical device 1800 to an energy source separate from the electrical device 1800 (e.g., AC line power).

The electrical device 1800 may include a display device 1806 (or corresponding interface circuitry, as discussed above). The display device 1806 may include any visual indicators, such as a heads-up display, a computer monitor, a projector, a touchscreen display, a liquid crystal display (LCD), a light-emitting diode display, or a flat panel display.

The electrical device 1800 may include an audio output device 1808 (or corresponding interface circuitry, as discussed above). The audio output device 1808 may include any device that generates an audible indicator, such as speakers, headsets, or earbuds.

The electrical device 1800 may include an audio input device 1824 (or corresponding interface circuitry, as discussed above). The audio input device 1824 may include any device that generates a signal representative of a sound, such as microphones, microphone arrays, or digital instruments (e.g., instruments having a musical instrument digital interface (MIDI) output).

The electrical device 1800 may include a GPS device 1818 (or corresponding interface circuitry, as discussed above). The GPS device 1818 may be in communication with a satellite-based system and may receive a location of the electrical device 1800, as known in the art.

The electrical device 1800 may include an other output device 1810 (or corresponding interface circuitry, as discussed above). Examples of the other output device 1810 may include an audio codec, a video codec, a printer, a wired or wireless transmitter for providing information to other devices, or an additional storage device.

The electrical device 1800 may include an other input device 1820 (or corresponding interface circuitry, as discussed above). Examples of the other input device 1820 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The electrical device 1800 may have any desired form factor, such as a handheld or mobile electrical device (e.g., a cell phone, a smart phone, a mobile internet device, a music player, a tablet computer, a laptop computer, a netbook computer, an ultrabook computer, a personal digital assistant (PDA), an ultra mobile personal computer, etc.), a desktop electrical device, a server device or other networked computing component, a printer, a scanner, a monitor, a set-top box, an entertainment control unit, a vehicle control unit, a digital camera, a digital video recorder, or a wearable electrical device. In some embodiments, the electrical device 1800 may be any other electronic device that processes data.

The following paragraphs provide various examples of the embodiments disclosed herein.

Example 1 is a microelectronic assembly, including a first microelectronic component having a first direct bonding region, wherein the first direct bonding region includes first metal contacts and a first dielectric material between adjacent ones of the first metal contacts; a second microelectronic component having a second direct bonding region and coupled to the first microelectronic component by the first and second direct bonding regions, wherein the second direct bonding region includes second metal contacts and a second dielectric material between adjacent ones of the second metal contacts, and wherein individual first metal contacts in the first direct bonding region are coupled to respective individual second metal contacts in the second direct bonding region; and a void between an individual first metal contact and a respective individual second metal contact.

Example 2 may include the subject matter of Example 1, and may further specify that a thickness of the void is greater than 10 nanometers.

Example 3 may include the subject matter of Example 1, and may further specify that a thickness of the void is between 1 nanometer and 10 nanometers.

Example 4 may include the subject matter of Example 1, and may further specify that the void is one of a plurality of voids.

Example 5 may include the subject matter of Example 4, and may further specify that the plurality of voids is arranged in a repeating pattern.

Example 6 may include the subject matter of Example 4, and may further specify that the plurality of voids has a first concentration in a perimeter area of the first and second direct bonding regions and a second concentration that is less than the first concentration in an inner area of the first and second direct bonding regions.

Example 7 may include the subject matter of Example 4, and may further specify that a number of voids is between 10 percent and 50 percent of a total number of first metal contacts.

Example 8 may include the subject matter of Example 4, and may further specify that the plurality of voids is distributed uniformly throughout the first and second direct bonding regions.

Example 9 may include the subject matter of Example 1, and may further specify that the void extends between the first dielectric material and the second dielectric material adjacent to an individual first metal contact and a respective individual second metal contact.

Example 10 is a microelectronic assembly, including an interposer having a first direct bonding region, wherein the first direct bonding region includes first metal contacts and a first dielectric material between adjacent ones of the first metal contacts; a microelectronic component having a second direct bonding region and coupled to the interposer by the first and second direct bonding regions, wherein the second direct bonding region includes second metal contacts and a second dielectric material between adjacent ones of the second metal contacts, and wherein individual first metal contacts in the first direct bonding region are coupled to respective individual second metal contacts in the second direct bonding region; and a void between an individual first metal contact and a respective individual second metal contact.

Example 11 may include the subject matter of Example 10, and may further specify that a thickness of the void is between 1 nanometer and 10 nanometers.

12 The microelectronic assembly of claim 10, and may further specify that a thickness of the void is between 10 nanometers and 100 nanometers.

Example 13 may include the subject matter of Example 10, and may further specify that the void is one of a plurality of voids arranged in a repeating pattern.

Example 14 may include the subject matter of Example 10, and may further specify that the void is one of a plurality of voids, and wherein the plurality of voids has a first concentration in a perimeter area of the first and second direct bonding regions and a second concentration that is less than the first concentration in an inner area of the first and second direct bonding regions.

Example 15 may include the subject matter of Example 10, and may further specify that the microelectronic component is a central processing unit, wherein the void is one of a plurality of voids, and wherein a ratio of voids to a total number of first metal contacts is between 1:2 and 1:10.

Example 16 may include the subject matter of Example 10, and may further specify that the microelectronic component is a graphics processing unit, wherein the void is one of a plurality of voids, and wherein a ratio of voids to a total number of first metal contacts is between 1:8 and 1:12.

Example 17 is a microelectronic assembly, including a package substrate; an interposer coupled to the package substrate at a first surface and having a first direct bonding region at an opposing second surface, wherein the first direct bonding region includes first metal contacts and a first dielectric material between adjacent ones of the first metal contacts; a microelectronic component having a second direct bonding region and coupled to the interposer by the first and second direct bonding regions, wherein the second direct bonding region includes second metal contacts and a second dielectric material between adjacent ones of the second metal contacts, and wherein individual first metal contacts in the first direct bonding region are coupled to respective individual second metal contacts in the second direct bonding region; and a void between an individual first metal contact and a respective individual second metal contact.

Example 18 may include the subject matter of Example 17, and may further specify that the void is one of a plurality of voids arranged in a repeating pattern.

Example 19 may include the subject matter of Example 17, and may further specify that the void is one of a plurality of voids and the plurality of voids is distributed uniformly throughout the first and second direct bonding regions.

Example 20 may include the subject matter of Example 17, and may further specify that the first surface of the interposer is coupled to the package substrate by a third direct bonding region.

The invention claimed is:

1. A microelectronic assembly, comprising:
   an interposer having a first direct bonding region, wherein the first direct bonding region includes first metal contacts and a first dielectric material between adjacent ones of the first metal contacts;
   a microelectronic component having a second direct bonding region, wherein the second direct bonding region includes second metal contacts and a second dielectric material between adjacent ones of the second metal contacts, wherein the microelectronic component is coupled to the interposer by interconnects, and wherein the interconnects include individual first metal contacts in the first direct bonding region coupled to respective individual second metal contacts in the second direct bonding region; and
   a void between an individual first metal contact that is not coupled to a respective individual second metal contact, wherein the void is in the second direct bonding region.

2. The microelectronic assembly of claim 1, wherein a thickness of the void is between 1 nanometer and 10 nanometers.

3. The microelectronic assembly of claim 1, wherein a thickness of the void is between 10 nanometers and 100 nanometers.

4. The microelectronic assembly of claim 1, wherein the void is one of a plurality of voids arranged in a repeating pattern.

5. The microelectronic assembly of claim 1, wherein the void is one of a plurality of voids, and wherein the plurality of voids has a first concentration in a perimeter area of the first and second direct bonding regions and a second concentration that is less than the first concentration in an inner area of the first and second direct bonding regions.

6. The microelectronic assembly of claim 1, wherein the microelectronic component is a central processing unit, wherein the void is one of a plurality of voids, and wherein a ratio of the plurality of voids to a total number of the first metal contacts is between 1:2 and 1:10.

7. The microelectronic assembly of claim 1, wherein the microelectronic component is a graphics processing unit, wherein the void is one of a plurality of voids, and wherein a ratio of the plurality of voids to a total number of the first metal contacts is between 1:8 and 1:12.

8. A microelectronic assembly, comprising:
   a package substrate;
   an interposer coupled to the package substrate at a first surface and having a first direct bonding region at an opposing second surface, wherein the first direct bonding region includes first metal contacts and a first dielectric material between adjacent ones of the first metal contacts;
   a microelectronic component having a second direct bonding region, wherein the second direct bonding region includes second metal contacts and a second dielectric material between adjacent ones of the second metal contacts, wherein the microelectronic component is coupled to the interposer by interconnects, and wherein the interconnects include individual first metal contacts in the first direct bonding region coupled to respective individual second metal contacts in the second direct bonding region; and
   a void between an individual first metal contact that is not coupled to a respective individual second metal contact, wherein the void is in the second direct bonding region.

9. The microelectronic assembly of claim 8, wherein the void is one of a plurality of voids arranged in a repeating pattern.

10. The microelectronic assembly of claim 8, wherein the void is one of a plurality of voids and the plurality of voids is distributed uniformly throughout the first and second direct bonding regions.

11. The microelectronic assembly of claim 8, wherein the first surface of the interposer is coupled to the package substrate by a third direct bonding region.

* * * * *